(12) United States Patent
Yamaguchi et al.

(10) Patent No.: US 6,650,001 B2
(45) Date of Patent: Nov. 18, 2003

(54) LATERAL SEMICONDUCTOR DEVICE AND VERTICAL SEMICONDUCTOR DEVICE

(75) Inventors: Yoshihiro Yamaguchi, Saitama (JP); Hideaki Ninomiya, Yokohama (JP); Tomoki Inoue, Tokyo-To (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 10/053,657

(22) Filed: Jan. 24, 2002

(65) Prior Publication Data

US 2002/0096741 A1 Jul. 25, 2002

(30) Foreign Application Priority Data

Jan. 25, 2001 (JP) ........................................ 2001-016624
Dec. 14, 2001 (JP) ........................................ 2001-381449

(51) Int. Cl.[7] .......................................... H01L 27/082
(52) U.S. Cl. ...................... 257/557; 257/401; 257/578
(58) Field of Search ................. 257/557, 565, 257/578, 592, 401

(56) References Cited

U.S. PATENT DOCUMENTS

| | | |
|---|---|---|
| 5,068,700 A | 11/1991 | Yamaguchi et al. |
| 5,105,243 A | 4/1992 | Nakagawa et al. |
| 6,064,086 A * | 5/2000 | Nakagawa et al. ......... 257/335 |
| 6,150,702 A * | 11/2000 | Funaki et al. ............... 257/409 |

* cited by examiner

*Primary Examiner*—Michael S. Lebentritt
*Assistant Examiner*—Brad Smith
(74) *Attorney, Agent, or Firm*—Oblon, Spivak, McClelland, Maier & Neustadt, P.C.

(57) ABSTRACT

A lateral semiconductor device includes an n-type buffer layer (15) selectively formed in the surface of an n-type base layer (14), a p-type drain layer (16) selectively formed in the surface of the n-type buffer layer (15), a p-type base layer (17) formed in the surface of the n-type base layer (14) so as to surround the n-type buffer layer (15), an n$^+$-type source layer (18) selectively formed in the surface of the p-type base layer (17), a source electrode (24) in contact with the p-type base layer (17) and the n$^+$-type source layer (18), a drain electrode (22) in contact with the p-type drain layer (16), and a gate electrode (20) formed via a gate insulating film (19) on the surface of the p-type base layer (17) sandwiched between the n$^+$-type source layer (18) and the n-type base layer (14). The p-type drain layer (16) has an annular structure or horseshoe-shaped structure, or is divided into a plurality of portions. This realizes a high breakdown voltage with a low ON voltage.

13 Claims, 23 Drawing Sheets

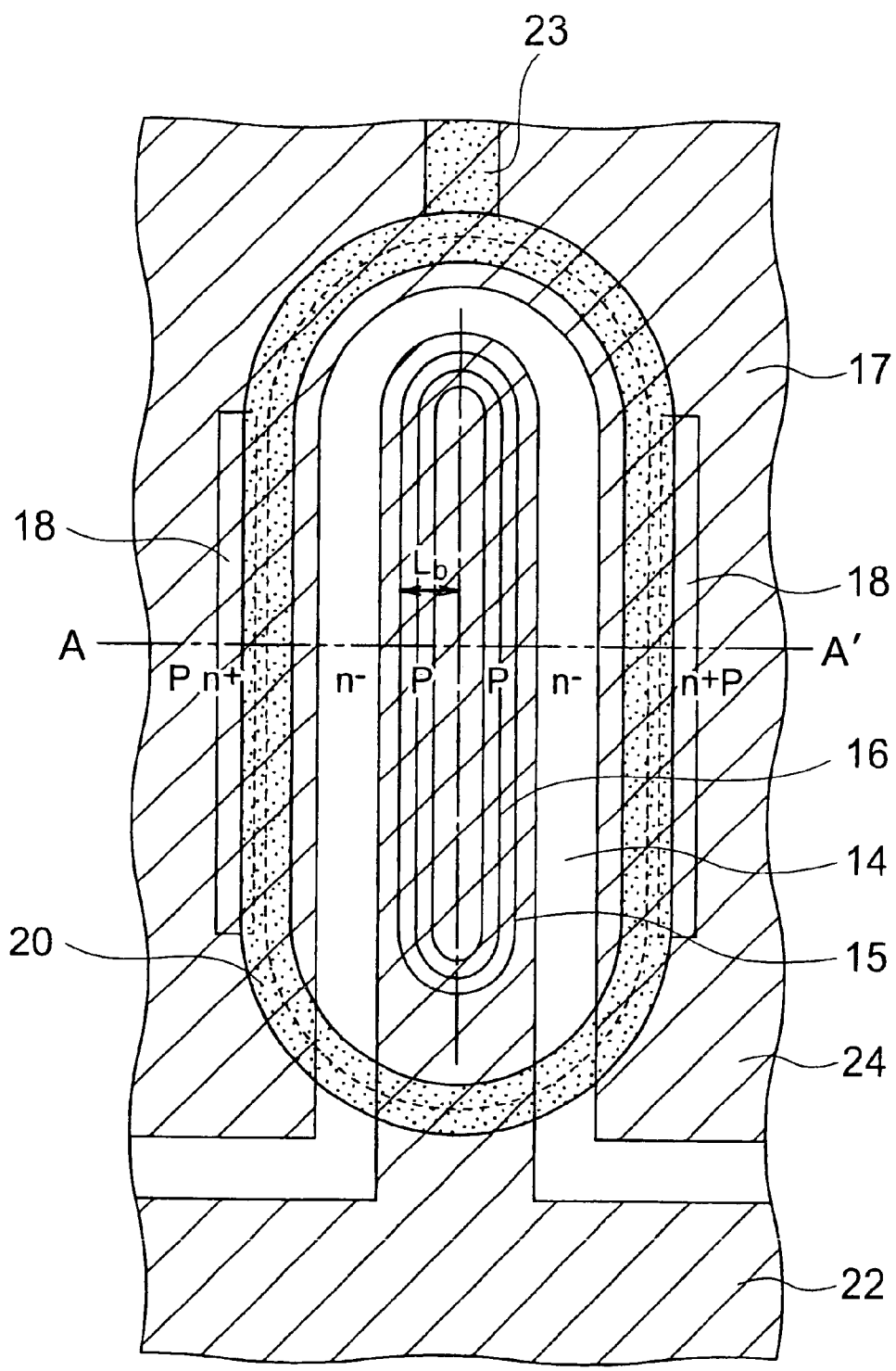
F I G. 1

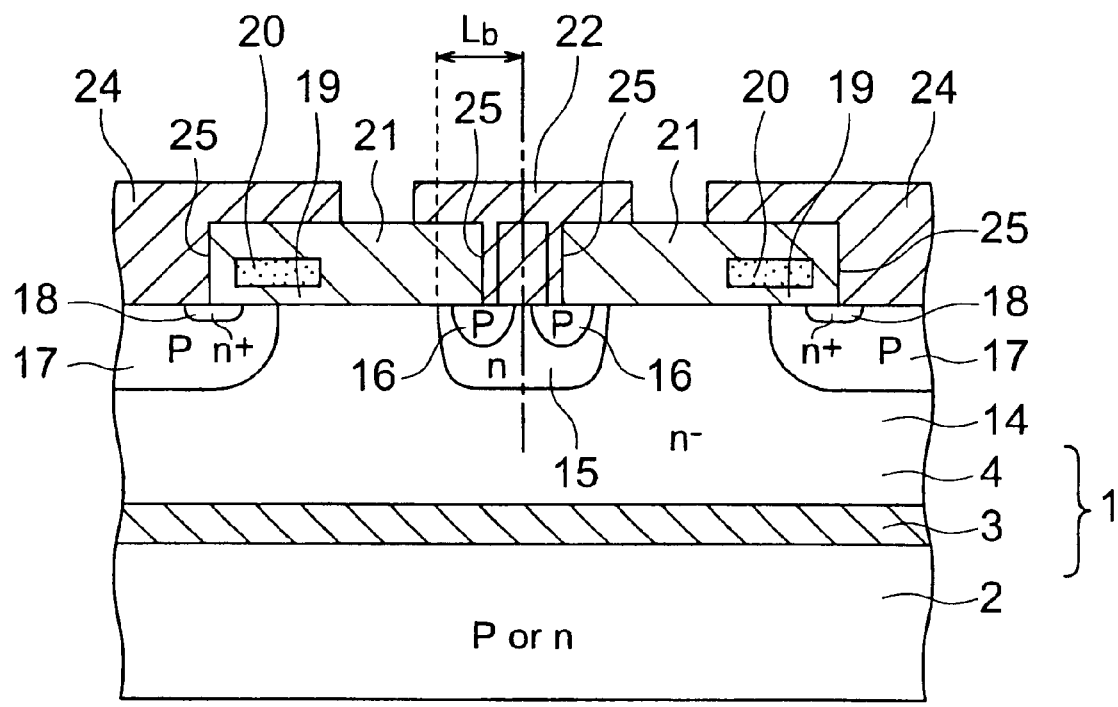
F I G. 2

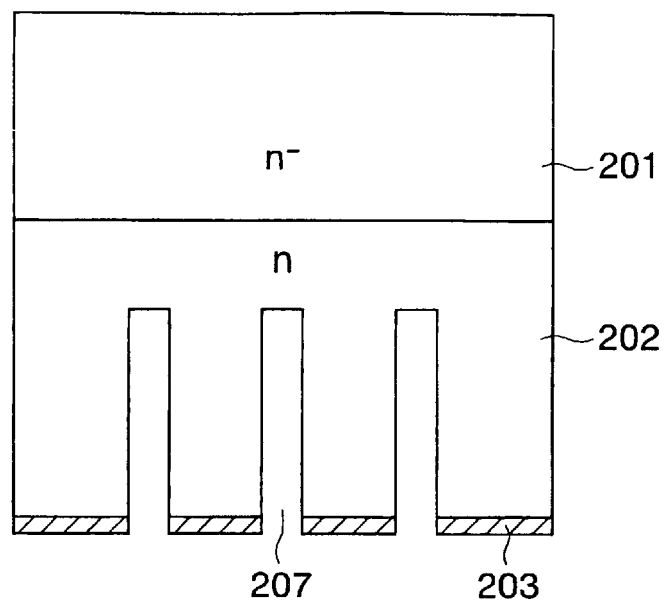
F I G. 17
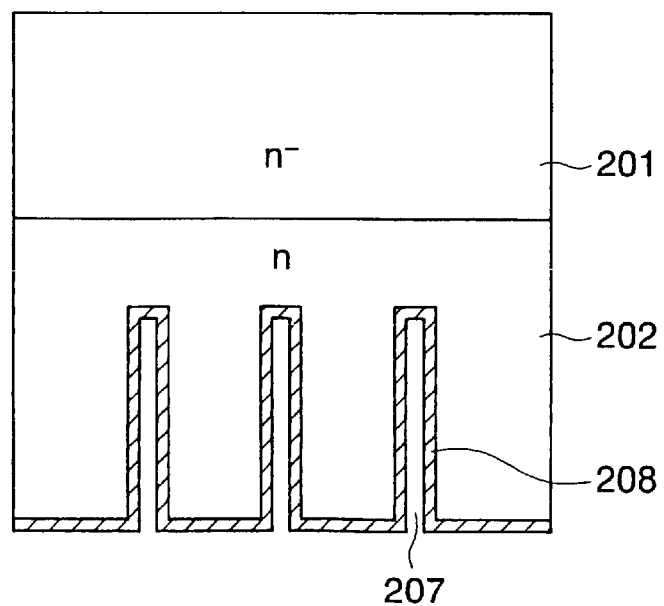
F I G. 18

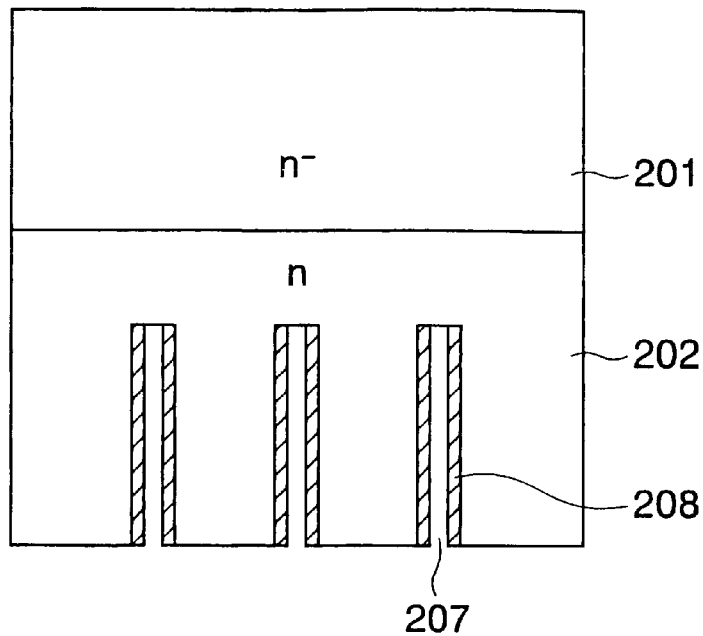
F I G. 19
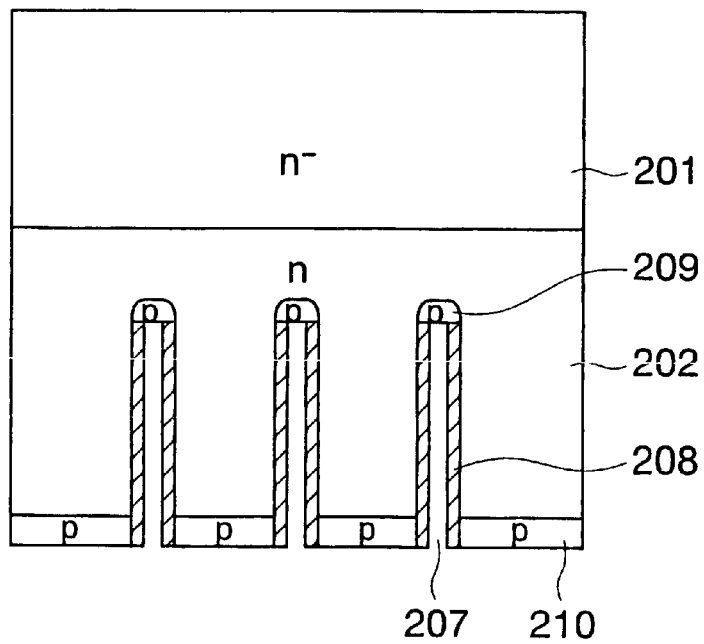
F I G. 20

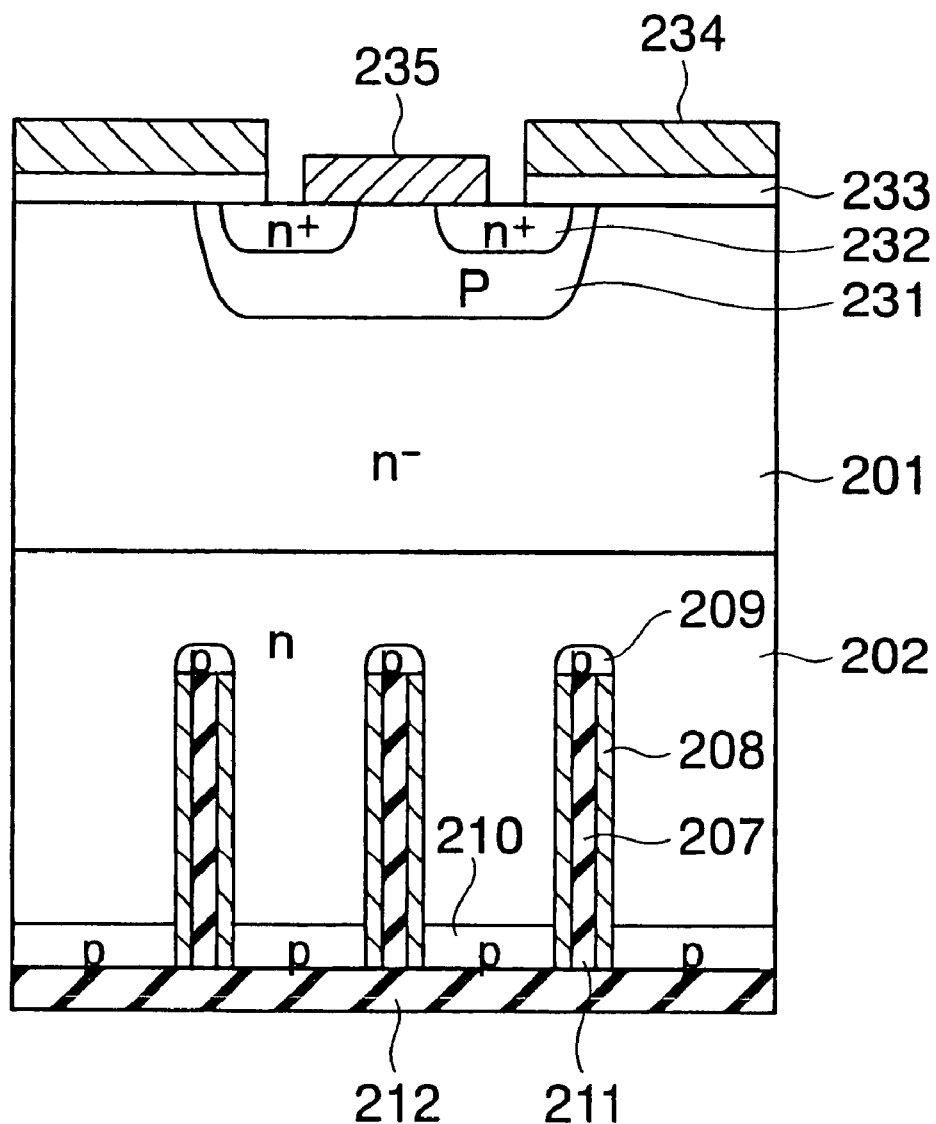
F I G. 23

LATERAL SEMICONDUCTOR DEVICE AND VERTICAL SEMICONDUCTOR DEVICE

CROSS REFERENCE TO RELATED APPLICATION

This application claims benefit of priority under 35 USC 119 to Japanese Patent Application No. 2001-16624, filed on Jan. 25, 2001 and Japanese Patent No. 2001-381449, filed on Dec. 14, 2001, the entire contents of which are incorporated by reference herein.

BACKGROUND OF THE INVENTION

The present invention relates to a lateral semiconductor device, particularly, a lateral insulated gate bipolar transistor (to be simply referred to as an IGBT hereinafter), and to a vertical semiconductor device, particularly, a vertical IGBT.

An IGBT as a insulated gate type high-voltage semiconductor device is a voltage-controlled semiconductor device. Since this facilitates the formation of a gate circuit, an IGBT is widely used in the field of power electronics such as inverters and switching power supplies. In particular, an IGBT is a power device having both high-speed switching characteristics of a MOSFET and high-output characteristics of a bipolar transistor. Also, a lateral IGBT which is advantageous in high integration is often used as an output device of a power IC. A power IC including a plurality of output devices is in many times fabricated using an SOI (Semiconductor On Insulator) substrate which is advantageous in dielectric isolation.

A lateral IGBT of this type related to the present invention will be explained below with reference to FIGS. 24 and 25. FIG. 24 is a plan view of the IGBT. FIG. 25 is a sectional view taken along a line A–A' in FIG. 24.

An SOI substrate 1101 has a support substrate 1102, a buried oxide film 1103, and an n$^-$-type base layer 1104. An n-type buffer layer 1105 is formed in the surface of the n$^-$-type layer 1104 by selective diffusion. This n-type buffer layer 1105 has a stripe shape whose two end portions protrude outward into the shape of an arc. A p-type drain layer 1106 is formed in the surface of the n-type buffer layer 1105 by selective diffusion. This p-type drain layer 1106 has the same shape as the n-type buffer layer 1105.

In the surface of the n$^-$-type base layer 1104, a p-type base layer 1107 is formed by selective diffusion so as to surround the n-type buffer layer 1105. The inner circumferential surface of this p-type base layer 1107 has the same shape as the n-type buffer layer 1105. Striped n$^+$-type source layer 1108 are formed in portions of the p-type base layer 1107 by selective diffusion on the two sides of the p-type drain layer 1106. These n$^+$-type source layers 1108 have substantially the same length as the straight portion of the p-type drain layer 1106.

On the p-type base layer 1107 sandwiched between the n$^-$-type base layer 1104 and the n$^+$-type source layers 1108, a gate electrode 1110 is formed via a gate insulating film 1109. This gate electrode 1110 is formed into an annular structure so as to surround the n-type buffer layer 1105. The inner circumferential surface of the gate electrode 1110 has the same shape as the outer circumferential surface of the n-type buffer layer 1105. In addition, a gate line 1113 for extracting the gate electrode to the outside is formed in a portion of the gate electrode.

An insulating film 1111 is formed on the exposed surfaces of the gate electrode 1110 and the n$^-$-type base layer 1104. A drain line 1112 and a source line 1114 are formed on this insulating film 1111. Contact holes 1115 are formed in predetermined positions of the insulating film 1111. Through these contact holes 1115, the drain line 1112 is in ohmic contact with the p-type drain layer 1106, and the source line 1114 is in ohmic contact with the p-type base layer 1107 and the n$^+$-type source layer 1108.

To obtain a high breakdown voltage in this lateral IGBT, a curvature R of the arc at the two end portions of the n-type buffer layer 1105 must be increased to some extent. To this end, a width Lb of the n-type buffer layer 1105 must be increased. If this width Lb of the n-type buffer layer 1105 is increased, the width of the p-type drain layer 1106 also increases, and this inevitably increases the area of the p-type drain layer 1106.

However, it is found by the experiments conducted by the present inventors that when the area of the p-type drain layer 1106 is increased by increasing the width Lb of the n-type buffer layer 1105, the ON voltage of the IGBT rises. FIG. 26 is a graph showing the relationship between the area of the p-type drain layer and the ON voltage of the IGBT. As shown in FIG. 26, this IGBT has the problem that when the width Lb of the n-type buffer layer 1105 is increased in order to obtain a high breakdown voltage, the area of the p-type drain layer 1106 increases, and this raises the ON voltage.

A vertical IGBT relevant to the present invention will be described next. FIG. 27 is a longitudinal sectional view showing this vertical IGBT.

This IGBT includes a drain electrode 1201, a p-type drain layer 1202, an n-type buffer layer 1203, an n$^-$-type base layer 1204, a p-type base layer 1205, an n$^+$-type source layer 1206, a gate insulating film 1207, a gate electrode 1208, and a source electrode 1209.

In this structure, when a voltage which is positive with respect to the source electrode 1209 is applied to the gate electrode 1208 while a voltage which is positive with respect to the source electrode 1209 is applied to the drain electrode 1201, the n$^+$-type source layer 1206 is electrically connected to the n$^-$-type base layer 1204 via a channel formed on the surface of the p-type base layer 1205 below the gate electrode 1208, so electrons are injected into the n$^-$-type base layer 1204. Also, holes in an amount corresponding to the injected electrons are injected from the p-type drain layer 1202 into the n$^-$-type base layer 1204.

This lowers the resistance of the high-resistance n$^-$-type base layer 1204 by conductivity modulation. Accordingly, the ON voltage can be made lower than that of a MOSFET having the same forward-blocking characteristics.

To turn off this IGBT, the application of the positive voltage to the gate electrode 1208 need only be stopped. Consequently, the injection of electrons into the n$^-$-type base layer 1204 stops, and the injection of holes stops accordingly. However, electrons and holes remaining in the n$^-$-type base layer 1204 keep flowing for a while as a recombination current which depends upon the lifetime of the n$^-$-type base layer 1204, and a drift current resulting from the spread of a depletion layer caused by the voltage rise.

To reduce the loss upon turning-off of the IGBT while the ON voltage is kept low, therefore, as shown in FIG. 28, it is necessary to increase the carrier amount in the source electrode 1209 and reduce the carrier amount in the drain electrode 1201. This is so because the depletion layer extends from the source and carriers in the drain remain to the last.

As a method of reducing the carrier amount in the drain, a method using the lightly doped p-type drain layer 1202 is proposed in the following reference.

J. Fugger et al., "Optimizing the vertical IGBT structure—The NPT concept as the most economic and electrically ideal solution for a 1200V IGBT", Proceedings of the 8th ISPSD, pp. 169–172, 1996.

In this method, it is necessary to form the n-type buffer layer 1203 at a minimum necessary concentration in order to hold the forward-blocking voltage, and to form the p-type drain layer 1202 at a low concentration in order to suppress the injection of holes.

The p-type drain layer 1202 is formed by ion implantation of boron and diffusion of the boron by high-temperature annealing. However, surface recession caused by the diffusion lowers the surface concentration of the boron, so no ohmic contact to the drain electrode 1201 can be formed, and injection of holes hardly occurs. Also, since the implantation dose of the boron is small, the device characteristics largely vary if the dose varies even slightly. This results in a small process margin.

Another problem of the vertical semiconductor device will be described below. Although an IGBT is a low-loss semiconductor device, attempts for decreasing the substrate thickness are recently being made to further reduce the loss. For example, the substrate thickness of an IGBT having a withstand voltage of 600 V is decreased to 50 $\mu$m.

However, when the n$^-$-type base layer is thinned by thinning the substrate, the substrate cracks in the device fabrication process.

As described above, the lateral semiconductor device related to the present invention has the problem that when the width Lb of the n-type buffer layer 1105 is increased in order to obtain a high breakdown voltage, the area of the p-type drain layer 1106 increases, and this raises the ON voltage.

Also, in the vertical semiconductor device described above, a very-lightly-doped p-type collector layer 1202 must be formed in order to obtain a good trade-off relationship between the ON voltage and the turn-off loss. However, in ion implantation and diffusion by high-temperature annealing as the formation method of this layer, the surface concentration is difficult to control. This causes variations in the device characteristics.

Furthermore, when the n-type base layer is thinned by thinning the substrate to thereby reduce the loss, the substrate cracks during the device fabrication process.

SUMMARY OF THE INVENTION

According to one aspect of the present invention, there is provided a lateral semiconductor device comprising a first conductivity type base layer having resistance higher than that of a first conductivity type buffer layer, the first conductivity type buffer layer selectively formed in the surface portion of the first conductivity type base layer, a second conductivity type drain layer selectively formed in the surface portion of the first conductivity type buffer layer, a second conductivity type base layer selectively formed in the surface portion of the first conductivity type base layer so as to surround the first conductivity type buffer layer with a spacing therebetween, a first conductivity type source layer selectively formed in the surface portion of the second conductivity type base layer, a gate electrode formed via a gate insulating film on the surface of the second conductivity type base layer sandwiched between the first conductivity type base layer and the first conductivity type source layer, a source electrode in contact with the second conductivity type base layer and the first conductivity type source layer, and a drain electrode in contact with the second conductivity type drain layer, wherein the second conductivity type drain layer has a structure in which the first conductivity type buffer layer not in contact with the drain electrode is exposed in a portion of the second conductivity type drain layer.

According to another aspect of the present invention, there is provided a vertical semiconductor device, comprising a first conductivity type base layer having resistance higher than that of a first conductivity type buffer layer, the first conductivity type buffer layer formed in one surface portion of the first conductivity type base layer, a second conductivity type drain layer selectively formed in a surface portion of the first conductivity type buffer layer, a second conductivity type base layer selectively formed in the other surface portion of the first conductivity type base layer, a first conductivity type source layer selectively formed in a surface portion of the second conductivity type base layer, a gate insulating film formed on the second conductivity type base layer between the first conductivity type source layer and the first conductivity type base layer, a gate electrode formed on the second conductivity type base layer via the gate insulating film, a drain electrode electrically connected to the second conductivity type drain layer, and a source electrode electrically connected to the first conductivity type source layer and the second conductivity type base layer, wherein the drain electrode is not electrically connected to the first conductivity type buffer layer.

According to still another aspect of the present invention, there is provided a vertical semiconductor device, comprising a first conductivity type base layer having resistance higher than that of a first conductivity type buffer layer, the first conductivity type buffer layer formed in one surface portion of the first conductivity type base layer, a plurality of trenches formed in the other surface portion of the first conductivity type base layer, a second conductivity type base layer formed to be shallower than the trenches, in the other surface portion of the first conductivity type base layer, a first conductivity type source layer formed on the two sides of each trench, in a surface portion of the second conductivity type base layer, a gate insulating film formed on the side walls and bottom surfaces of the trenches, a gate electrode formed via the gate insulating film so as to fill the trenches, a source electrode electrically connected to the first conductivity type source layer and the second conductivity type base layer, a second conductivity type drain layer selectively formed in a surface portion of the first conductivity type buffer layer, and a drain electrode electrically connected to the second conductivity type drain layer, wherein the drain electrode is not electrically connected to the first conductivity type buffer layer.

According to still another aspect of the present invention, there is provided a vertical semiconductor device, comprising a first conductivity type semiconductor substrate having resistance higher than that of a first conductivity type buffer layer, the first conductivity type buffer layer formed in one surface portion of the first conductivity type semiconductor substrate, a plurality of first trenches formed in the other surface portion of the first conductivity type semiconductor substrate, a second conductivity type base layer formed to be shallower than the first trenches, in the other surface portion of the first conductivity type semiconductor substrate, a first conductivity type source layer formed on the two sides of each first trench, in a surface portion of the second conductivity type base layer, a first insulating film formed on the side walls and bottom surfaces of the first trenches, a gate electrode formed inside the first trenches via the first insulating film so as to fill the first trenches, a source electrode connected to the first conductivity type source layer and the second conductivity type base layer, a second trench formed in the first conductivity type buffer layer, a second insulating film formed on the side walls of the second trench, a second conductivity type first drain layer formed in a bottom surface portion of the second trench, a second conductivity type second drain layer formed to be shallower than the second trench, in a surface portion of the first conductivity type buffer layer, a buried drain electrode formed inside the second trench via the second insulating film so as to fill the second trench, and connected to the second conductivity type first drain layer, and a drain electrode connected to the second conductivity type second drain layer and the buried drain electrode.

According to still another aspect of the present invention, there is provided a vertical semiconductor device, comprising a first conductivity type semiconductor substrate having resistance higher than that of a first conductivity type buffer layer, the first conductivity type buffer layer formed in one surface portion of the first conductivity type semiconductor substrate, a second conductivity type base layer selectively formed in the other surface portion of the first conductivity type semiconductor substrate, a first conductivity type source layer selectively formed in a surface portion of the second conductivity type base layer, a gate insulating film formed on the second conductivity type base layer between the first conductivity type source layer and the first conductivity type semiconductor substrate, a gate electrode formed on the second conductivity type base layer via the gate insulating film, a source electrode connected to the first conductivity type source layer and the second conductivity type base layer, a trench formed in the first conductivity type buffer layer, an insulating film formed on the side walls of the trench, a second conductivity type first drain layer formed in a bottom surface portion of the trench, a second conductivity type second drain layer formed to be shallower than the trench, in a surface portion of the first conductivity type buffer layer, a buried drain electrode formed inside the trench via the insulating film so as to fill the trench, and connected to the second conductivity type first drain layer, and a drain electrode connected to the second conductivity type second drain layer and the buried drain electrode.

BRIEF DESCRIPTION OF THE DRAWINGS

FIG. 1 is a plan view of a lateral IGBT according to the first embodiment of the present invention;

FIG. 2 is a longitudinal sectional view of the lateral IGBT taken along a line A–A' in FIG. 1;

FIG. 17 is a longitudinal sectional view showing a step of fabricating the vertical IGBT according to the 10th embodiment;

FIG. 18 is a longitudinal sectional view showing a step of fabricating the vertical IGBT according to the 10th embodiment;

FIG. 19 is a longitudinal sectional view showing a step of fabricating the vertical IGBT according to the 10th embodiment;

FIG. 20 is a longitudinal sectional view showing a step of fabricating the vertical IGBT according to the 10th embodiment;

FIG. 23 is a longitudinal sectional view showing another modification of the vertical IGBT according to the 10th embodiment;

DESCRIPTION OF THE PREFERRED EMBODIMENTS

Figure 3:
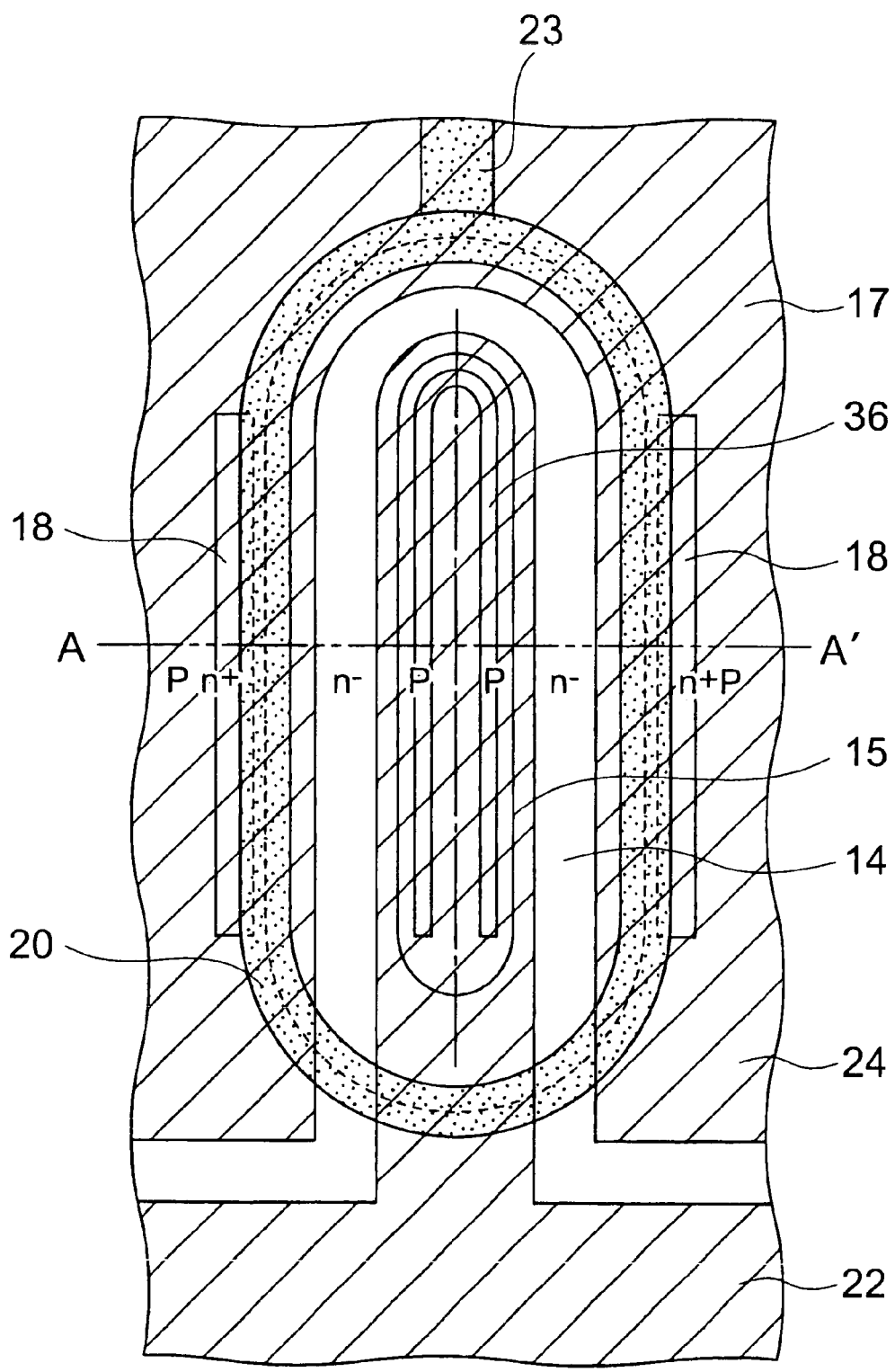
FIG. 3 is a plan view of a lateral IGBT according to the second embodiment of the present invention.

Embodiments of the present invention will be described below with reference to the accompanying drawings. Each embodiment presents an n-channel IGBT in which the first conductivity type is n-type and the second conductivity type is p-type. The same reference numerals denote components having substantially the same functions and configuration, and a duplicate explanation thereof will be made only where necessary.

First Embodiment

FIG. 1 is a plan view schematically showing a lateral IGBT according to the first embodiment of the present invention. FIG. 2 is a sectional view taken along a line A–A' in FIG. 1.

An SOI substrate 1 has a silicon support substrate 2, a buried oxide film 3, and a high-resistance, n$^-$-type silicon active layer 4. In the IGBT of this embodiment, the n$^-$-type silicon active layer 4 is used as an n⁻-type base layer 14. An n-type buffer layer 15 is formed in the surface of the n⁻-type base layer 14 by selective diffusion. This n-type buffer layer 15 has a stripe shape whose two, upper and lower end portions protrude outward into the shape of an arc having a curvature R. A p-type drain layer 16 is formed in the surface of the n-type buffer layer 15 by selective diffusion.

In this embodiment, the p-type drain layer 16 has the same shape as the n-type buffer layer 15 and has an annular structure.

In the surface of the n⁻-type base layer 14, a p-type base layer 17 is formed by selective diffusion so as to surround the n-type buffer layer 15 with a spacing between them. The inner circumferential surface of this p-type base layer 17 has the same shape as the n-type buffer layer 15.

Striped n⁺-type source layers 18 are formed in portions of the p-type base layer 17 by selective diffusion on the two sides of the p-type drain layer 16. These n⁺-type source layers 18 have substantially the same length as the straight portion of the p-type drain layer 16.

On the p-type base layer 17 sandwiched between the n⁻-type base layer 14 and the n⁺-type source layers 18, a gate electrode 20 is formed via a gate insulating film 19. This gate electrode 20 is formed into an annular structure so as to surround the n-type buffer layer 15. The inner circumferential surface of the gate electrode 20 has the same shape as the n-type buffer layer 15. In addition, a gate line 23 for extracting the gate electrode to the outside is formed in a portion of the gate electrode.

An insulating film 21 is formed on the exposed surfaces of the gate electrode 20 and the n⁻-type base layer 14. A drain line 22 and a source line 24 are formed on this insulating film 21.

Contact holes 25 are formed in predetermined positions of the insulating film 21. Through these contact holes 25, the drain line 22 is in ohmic contact with the p-type drain layer 16, and the source line 24 is in ohmic contact with the p-type base layer 17 and the n⁺-type source layer 18.

In the lateral IGBT of this embodiment, the p-type drain layer 16 has an annular structure. So, the area of this p-type drain layer 16 is smaller than that in the aforementioned lateral IGBT relevant to the present invention.

Accordingly, the ON voltage does not rise even when a width Lb of the n-type buffer layer 15 is increased to raise the breakdown voltage, since the area of the p-type drain layer is reduced.

Second Embodiment

FIG. 3 is a plan view of a lateral IGBT according to the second embodiment of the present invention. A sectional view taken along a line A–A' in FIG. 3 is the same as FIG. 2, so this sectional view will be omitted.

A difference of this embodiment from the above first embodiment is that in the first embodiment the p-type drain layer 16 has an annular structure, but in this embodiment a p-type drain layer 36 has a horseshoe-shaped or inverse U-shaped structure formed by cutting away in the horizontal direction (a lateral direction on the paper surface) one of the upper and lower end portions, e.g., the lower end portion of the p-type drain layer 16 having the annular structure in the first embodiment. The rest of the arrangement is the same as the first embodiment.

In the lateral IGBT of this embodiment, the area of the p-type drain layer 36 is smaller than the aforementioned IGBT related to the present invention. As in the first embodiment described above, therefore, the breakdown voltage can be raised without raising the ON voltage.

An electric current is concentrated to the arcuated end portion of the p-type drain layer 36, so the device may be destroyed in this portion. However, although two, upper and lower arcuated end portions are formed in the first embodiment, only one arcuated end portion is formed in this embodiment. This reduces the possibility of device destruction.

Figure 4:
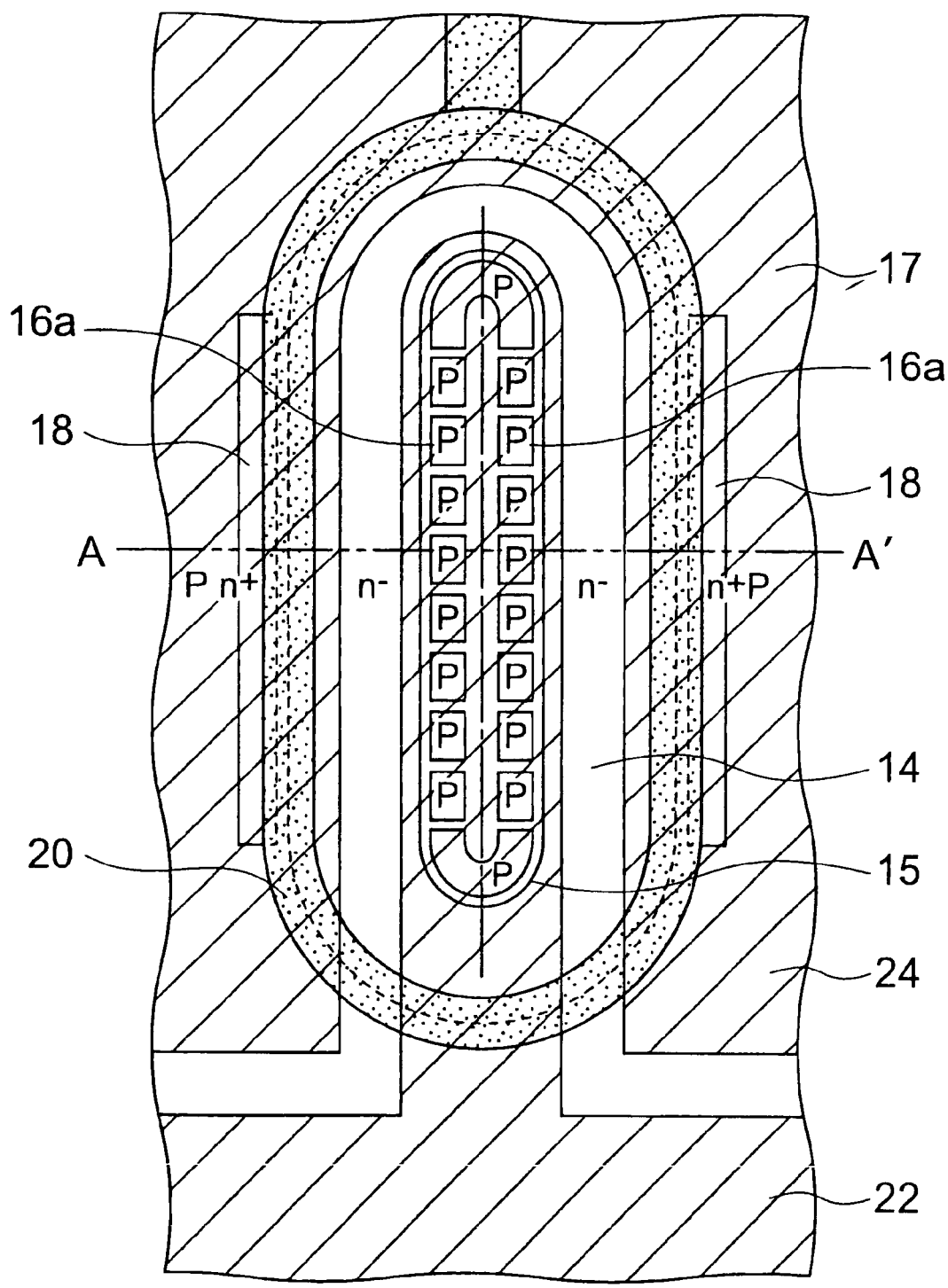
FIG. 4 is a plan view showing a modification of the lateral IGBT according to the first embodiment.

Furthermore, the p-type drain layer 16 in the first embodiment can also be an aggregate of a plurality of rectangular drain layer portions 16a as shown in FIG. 4.

Figure 5:
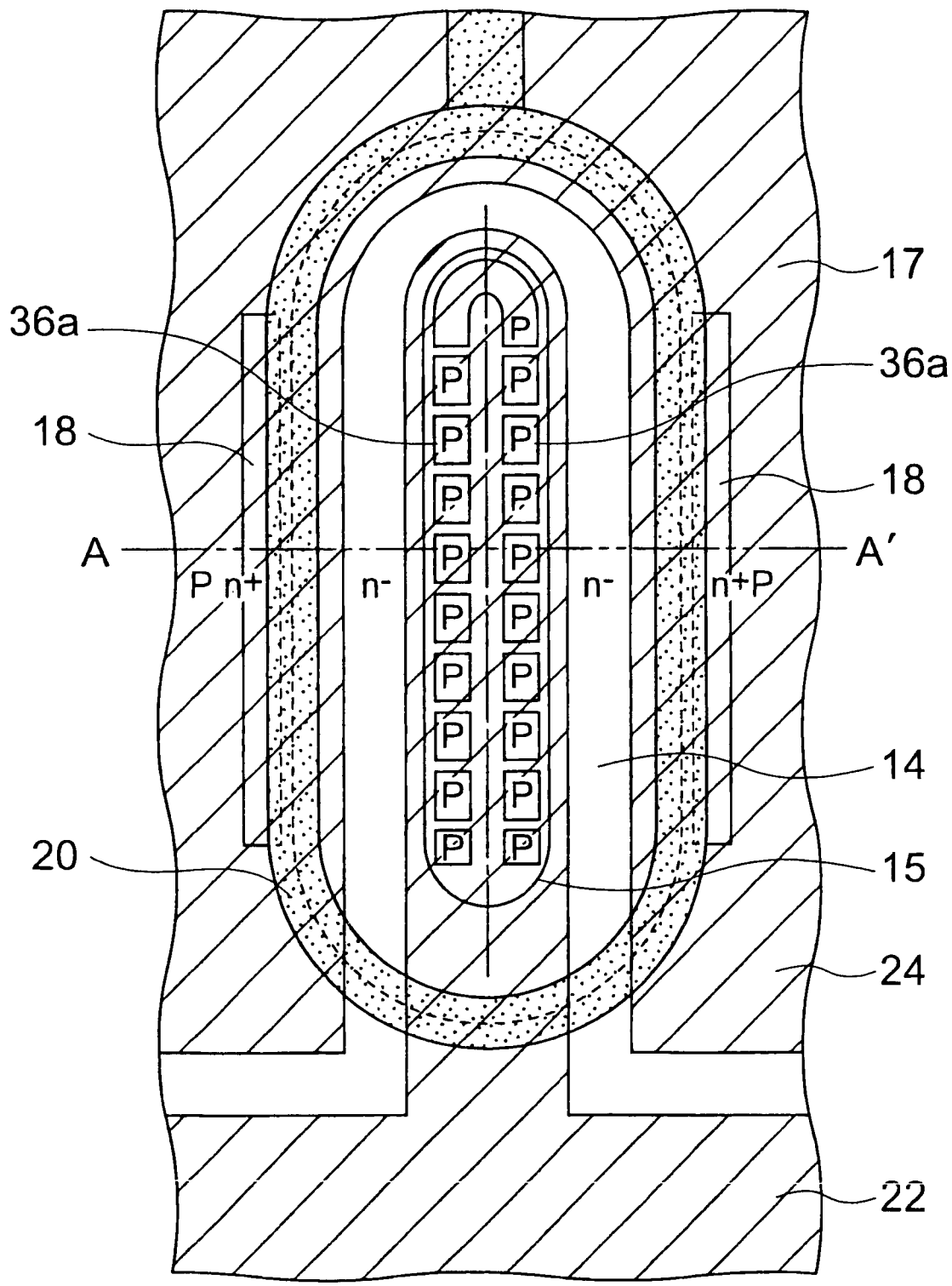
FIG. 5 is a plan view showing a modification of the lateral IGBT according to the second embodiment.

Likewise, the p-type drain layer 36 in the second embodiment can also be an aggregate of a plurality of rectangular drain layer portions 36a as shown in FIG. 5.

Third Embodiment

Figure 6:
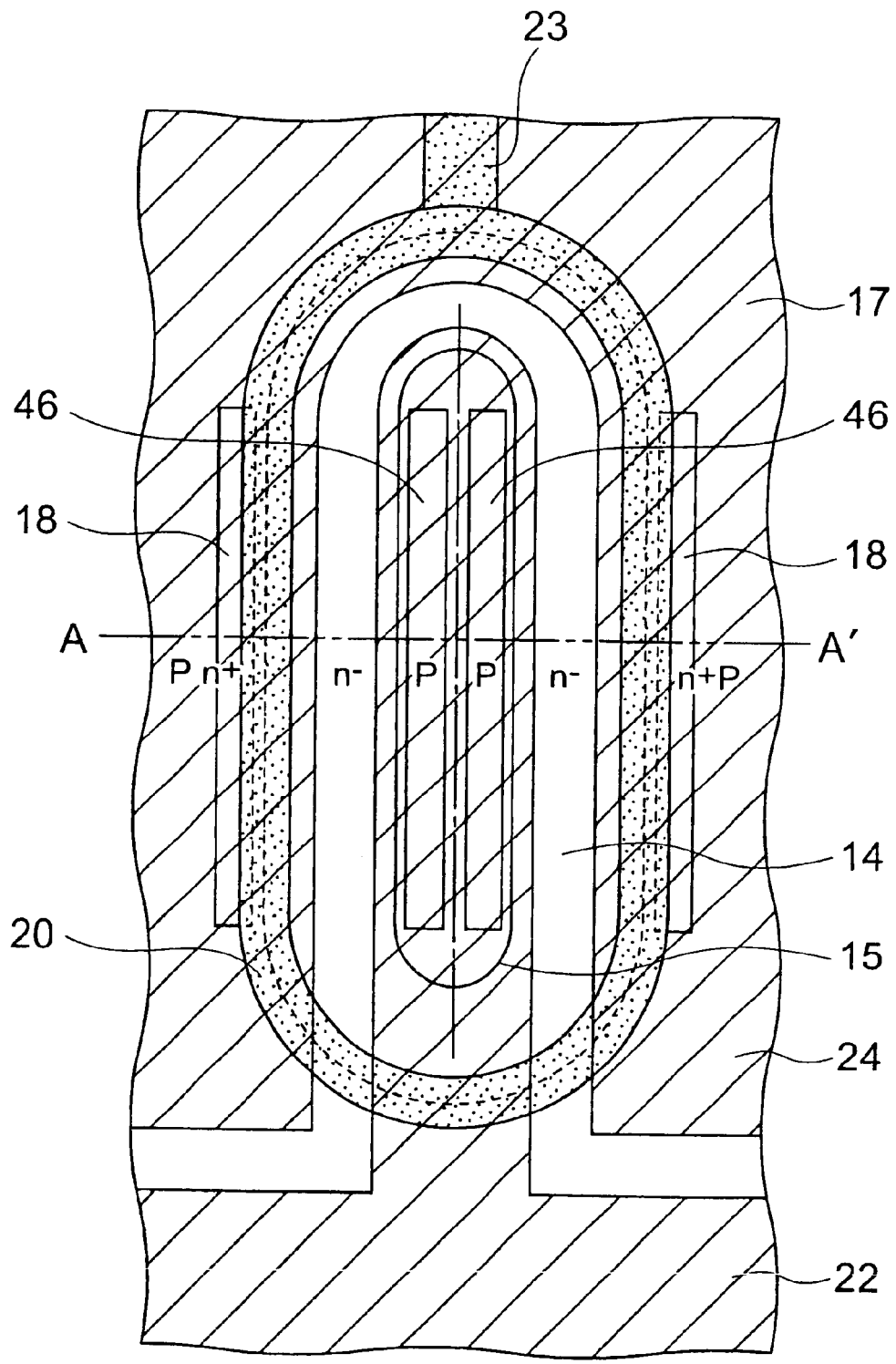
FIG. 6 is a plan view of a lateral IGBT according to the third embodiment of the present invention.

FIG. 6 is a plan view of a lateral IGBT according to the third embodiment of the present invention. A sectional view taken along a line A–A' in FIG. 6 is the same as FIG. 2, so this sectional view will be omitted.

A difference of this embodiment from the above first embodiment is that in the first embodiment the p-type drain layer 16 has an annular structure, but in this embodiment p-type drain layers 46 are two striped structures formed by cutting away in the horizontal direction the upper and lower end portions of the p-type drain layer 16 having the annular structure in the first embodiment. The rest of the arrangement is the same as the first embodiment.

In the lateral IGBT of this embodiment, the area of the p-type drain layers 46 is smaller than that in the aforementioned IGBT related to the present invention. As in the first embodiment described above, therefore, the breakdown voltage can be raised without raising the ON voltage.

Also, the p-type drain layers have no arcuated portions in the upper and lower end portions. Hence, unlike in the first and second embodiments, no electric current is concentrated to arcuated end portions to destroy the device.

Fourth Embodiment

Figure 7:
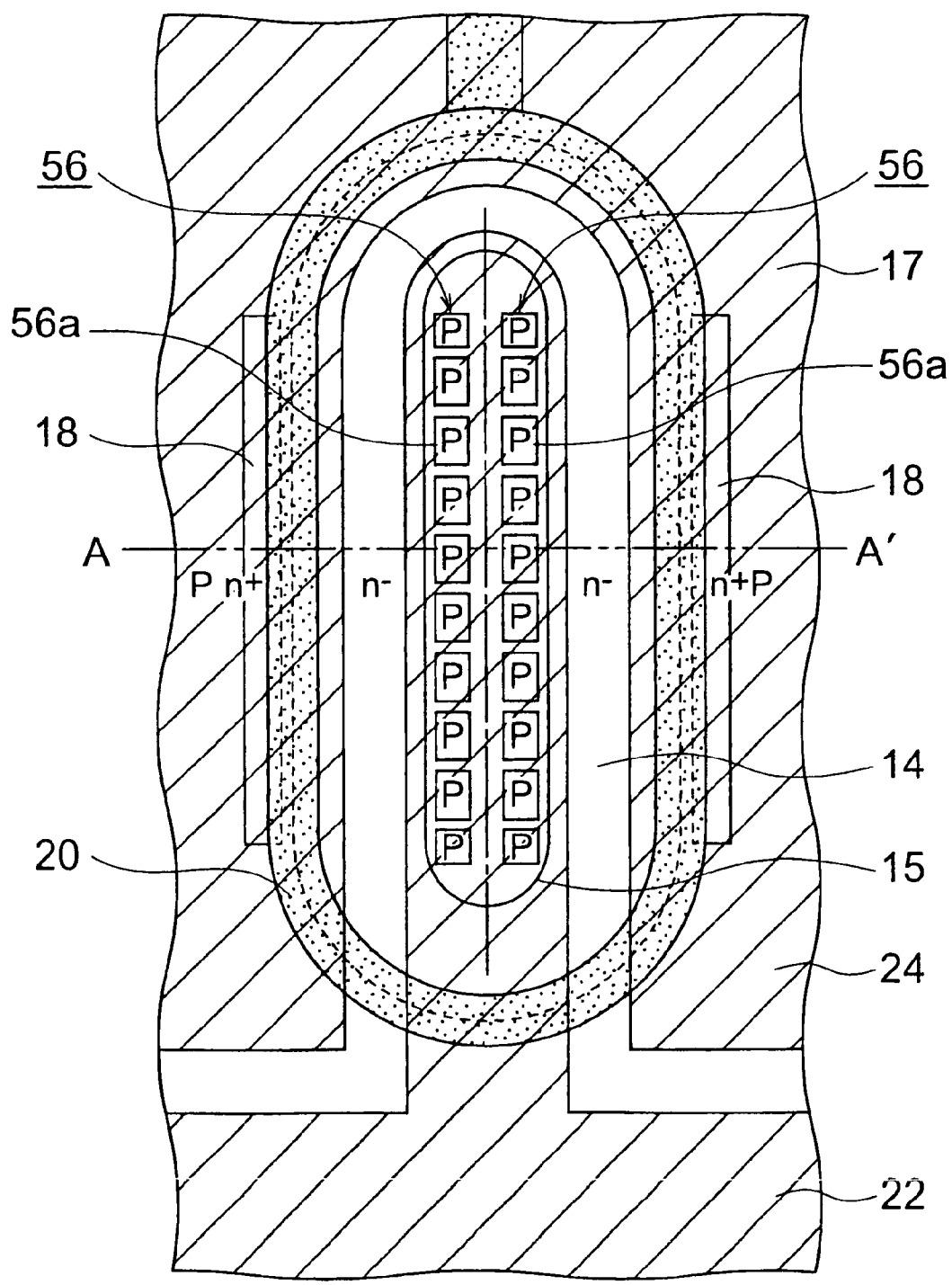
FIG. 7 is a plan view of a lateral IGBT according to the fourth embodiment of the present invention.

FIG. 7 is a plan view of a lateral IGBT according to the fourth embodiment of the present invention. A sectional view taken along a line A–A' in FIG. 6 is the same as FIG. 2, so this sectional view will be omitted.

A difference of this embodiment from the above first embodiment is that in the first embodiment the p-type drain layer 16 has an annular structure, but in this embodiment p-type drain layers 56 are two striped structures formed by cutting away in the horizontal direction the upper and lower end portions of the p-type drain layer 16 having the annular structure in the first embodiment, and that the p-type drain layer of each stripe is divided into a plurality of p-type drain layer portions 56a in the horizontal direction. In other words, the p-type drain layers 46 in the above third embodiment are divided into the form of a mesh. The rest of the arrangement is the same as the first embodiment.

In the lateral IGBT of this embodiment, the area of the p-type drain layers 56 is smaller than those of the p-type drain layers 16, 36, and 46 in the first, second, and third embodiments described above. Therefore, the breakdown voltage can be made higher than those in the first to third embodiments.

Also, the p-type drain layers have no arcuated portions in the upper and lower end portions. Hence, unlike in the first and second embodiments, no electric current is concentrated to arcuated end portions to destroy the device.

Fifth Embodiment

Figure 8:
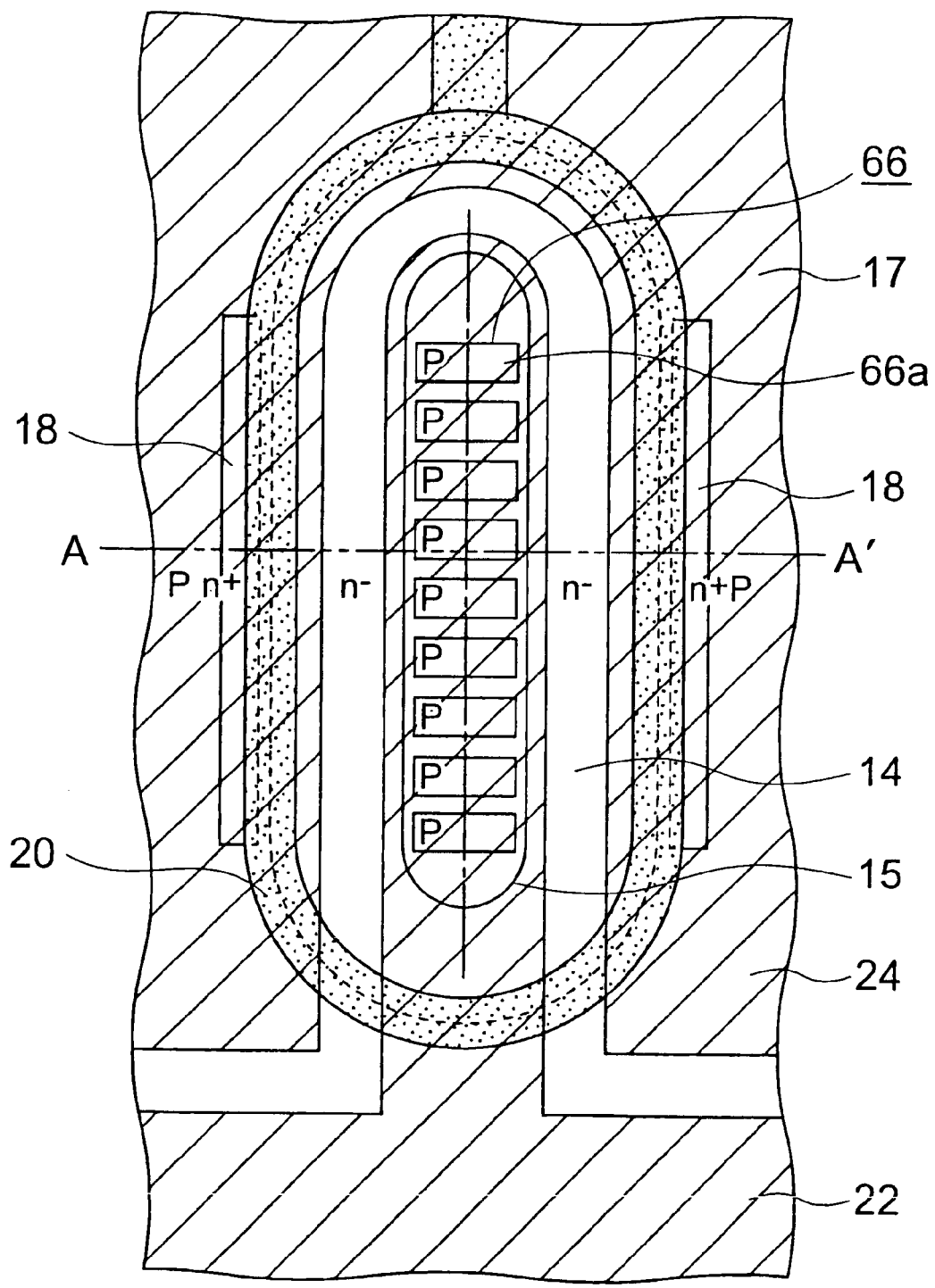
FIG. 8 is a plan view of a lateral IGBT according to the fifth embodiment of the present invention.
Figure 25:
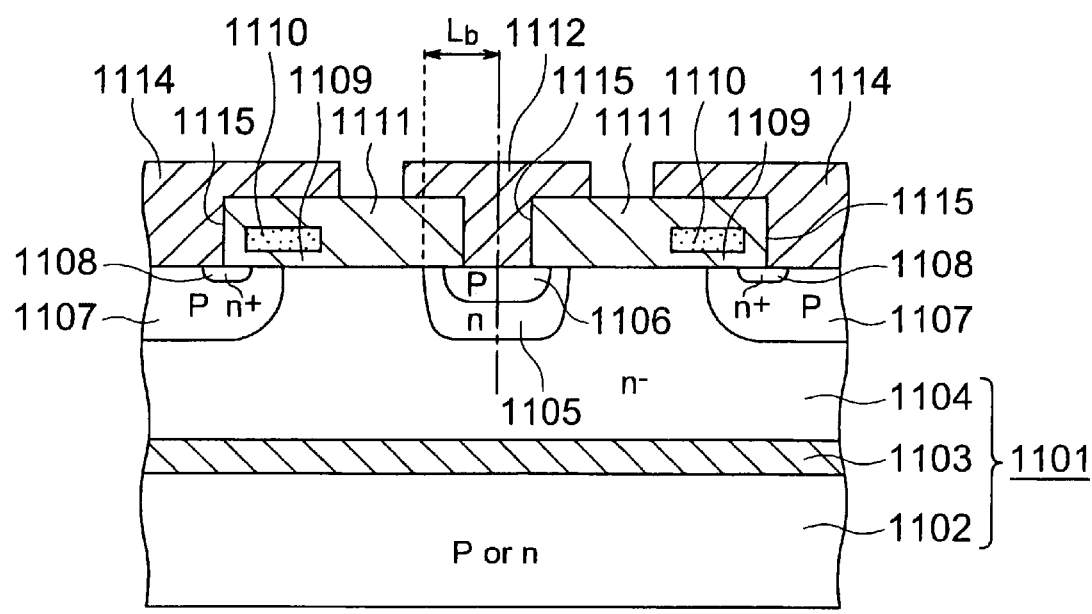
FIG. 25 is a sectional view of the lateral IGBT taken along a line A–A' in FIG. 24.
Figure 26:
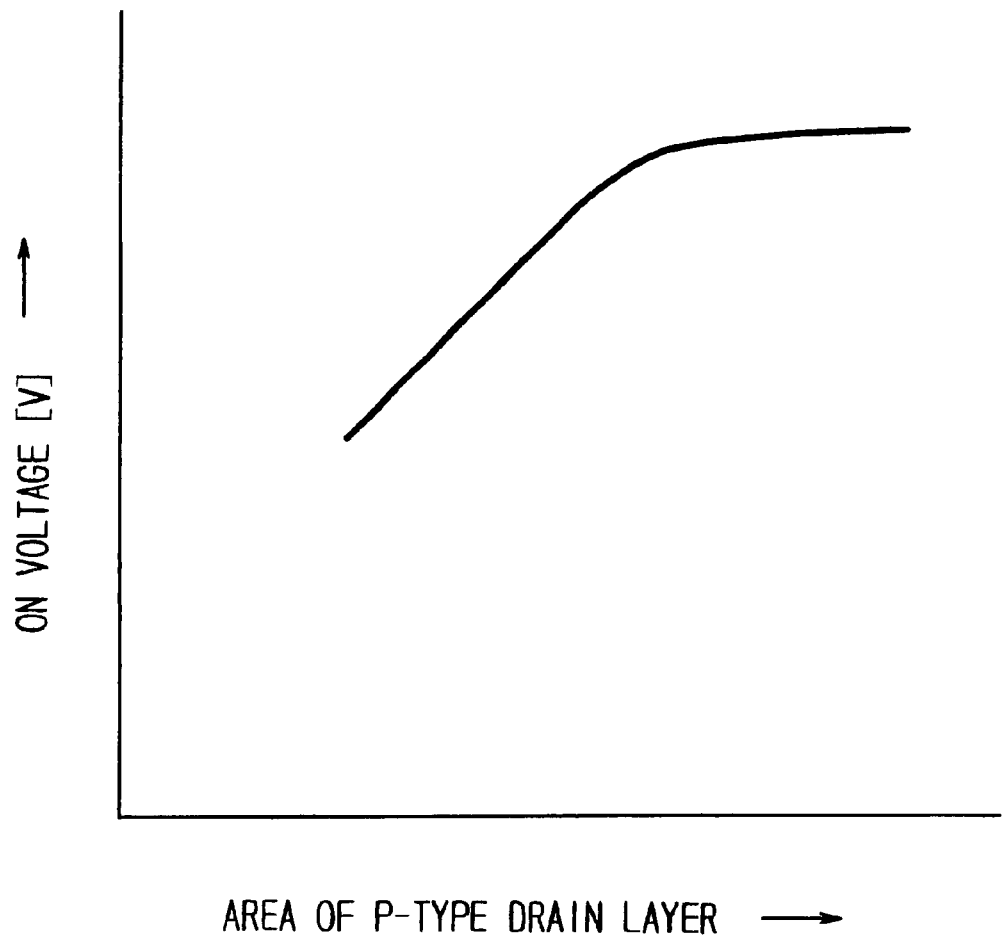
FIG. 26 is a graph showing the relationship, obtained by experiments, between the area of a drain layer and the ON voltage of an IGBT.

FIG. 8 is a plan view of a lateral IGBT according to the fifth embodiment of the present invention. A sectional view taken along a line A–A' in FIG. 8 is the same as FIG. 25, so this sectional view will be omitted.

A difference of this embodiment from the above first embodiment is that in the first embodiment the p-type drain layer 16 has an annular structure, but in this embodiment a p-type drain layer 66 is formed into the shape of a stripe and divided into a plurality of p-type drain layer portions 66a in the horizontal direction. That is, the rectangular p-type drain layer portions 66a are arranged into the form of a ladder. The rest of the arrangement is the same as the first embodiment.

In the lateral IGBT of this embodiment, the area of the p-type drain layer 66 is smaller than that of the above-mentioned lateral IGBT relevant to the present invention. Therefore, the breakdown voltage can be raised with no rise of the ON voltage, as in the above embodiments.

Also, the p-type drain layer 66 has no arcuated portions in the upper and lower end portions. Hence, unlike in the first and second embodiments, no electric current is concentrated to arcuated end portions to destroy the device.

Note that the present invention is not limited to the above embodiments and can be practiced in the form of various modifications without departing from the gist of the invention.

For example, each of the above embodiments is explained by taking an n-channel lateral IGBT in which the first conductivity type is n-type and the second conductivity type is p-type as an example. However, the present invention is also applicable to a p-channel lateral IGBT. In this case, the first conductivity type is p-type, and the second conductivity type is n-type.

Also, the present invention is not restricted to the drain layer structures of the above embodiments, i.e., these structures can also be combined. For example, as explained above with reference to FIGS. 4 and 5, it is also possible to combine the fourth embodiment with each of the first and second embodiments to divide the drain layer having an annular structure and the drain layer having a horseshoe-shaped (inverse U-shaped) structure into a plurality of drain layer portions, thereby forming an annular structure and a horseshoe-shaped structure each made up of a plurality of divided drain layer portions.

Furthermore, the present invention is not limited to the IGBTs of the above embodiments. For example, the present invention is also applicable to other bipolar devices such as npn and pnp transistors, a GTO, and an EST.

Vertical IGBTs according to the sixth to 10th embodiments of the present invention will be described below.

Sixth Embodiment

A vertical IGBT according to the sixth embodiment of the present invention will be explained below with reference to FIG. 9.

Figure 27:
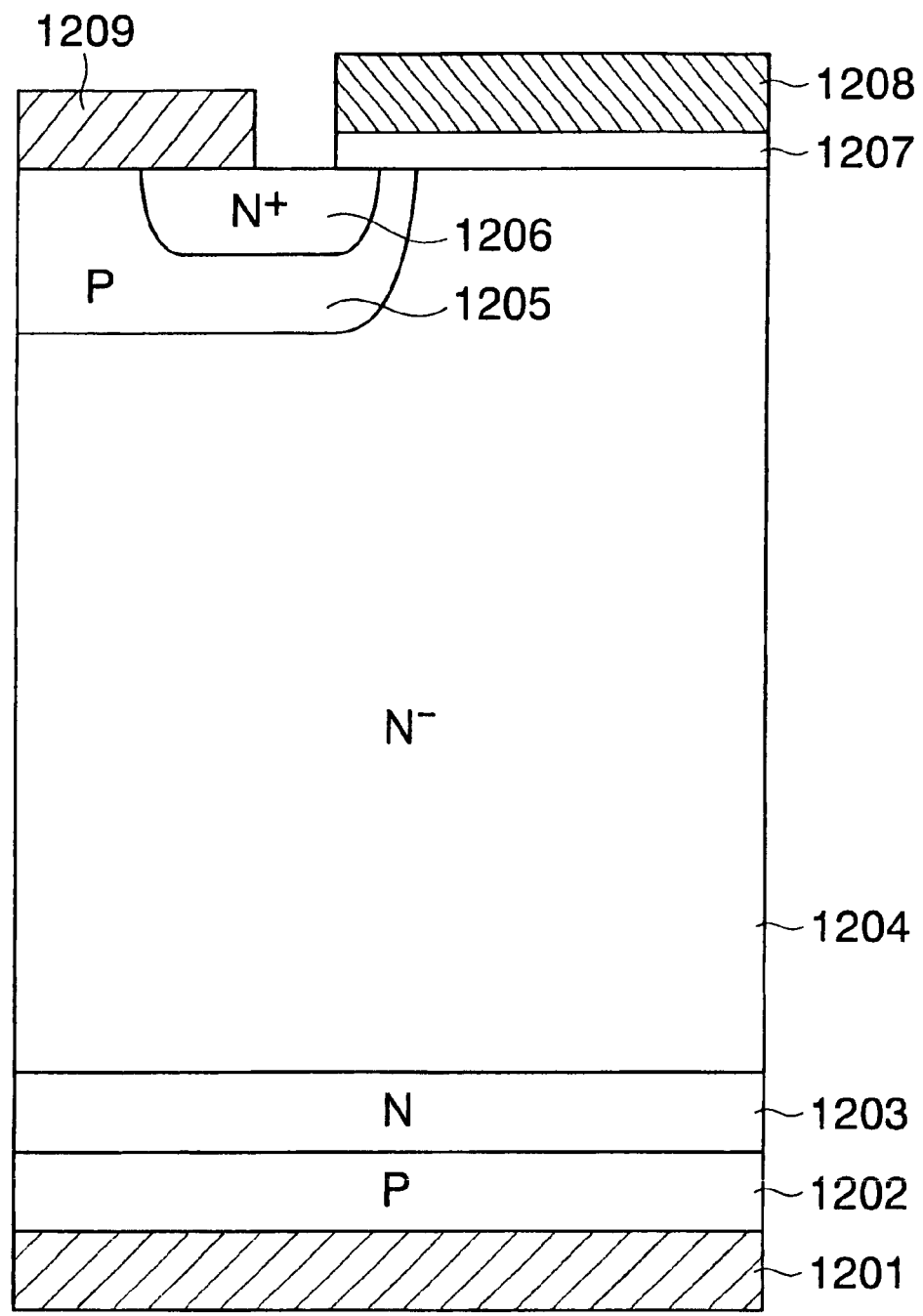
FIG. 27 is a longitudinal sectional view of a vertical IGBT relevant to the present invention.
Figure 28:
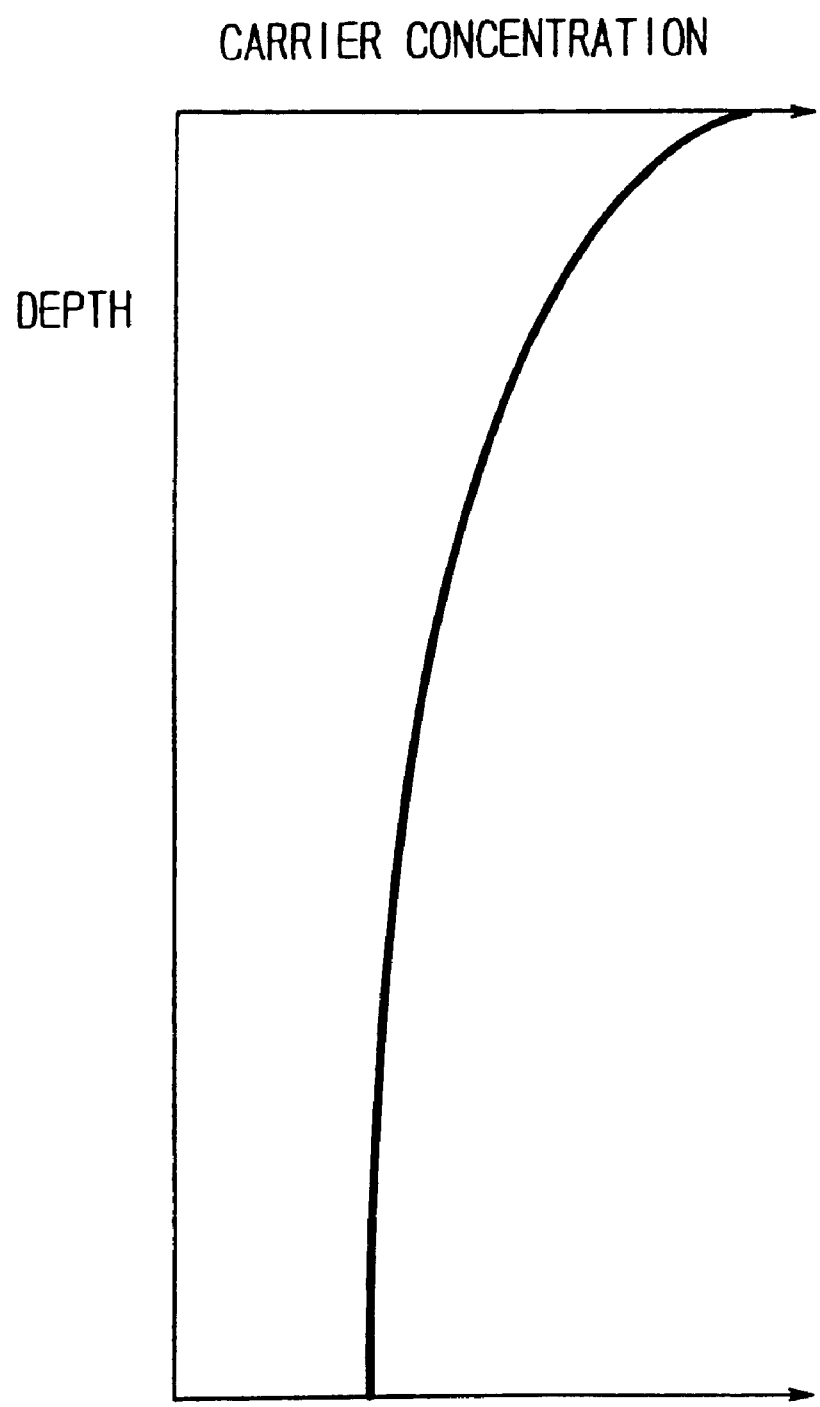
FIG. 28 is a graph showing the concentration profile of the same vertical IGBT.

In the vertical IGBT shown in FIG. 27, the p-type drain layer 1202 is formed on the entire surface of the drain side of the device. In this embodiment, however, a p-type drain layer 110 is formed not on the entire surface of the drain side but in a portion of an n-type buffer layer 103. Accordingly, a drain electrode 111 is formed not on the entire surface of the collector side but on the p-type drain layer 110. An n⁻-type base layer 104, a p-type base layer 105, an n⁺-type source layer 106, a gate insulating film 107, a gate electrode 108, and a source electrode 109 are the same as the n⁻-type base layer 1204, the p-type base layer 1205, the n⁺-type source layer 1206, the gate insulating film 1207, the gate electrode 1208, and the source electrode 1209, respectively, shown in FIG. 27, so a detailed description thereof will be omitted.

In this structure, the surface concentration (Cp) of the p-type drain layer 110 is set to satisfy $$cp > 1 \times 10^{19}\ cm^{-3}$$

so that a perfect ohmic junction with the drain electrode 111 is obtained. This numerical value is based on the description of the following reference.

S. M. Sze, "Physics of Semiconductor Devices 2nd Edition". p. 305, 1981

Since the p-type drain layer 110 has the above structure, the efficiency of injection of holes from the drain electrode 111 can be controlled by the area ratio, not the concentration, of the p-type drain layer 110. This can solve the problems of the ohmic junction and the process margin concerning variations in dose in the IGBT shown in FIG. 27.

Seventh Embodiment

Figure 10:
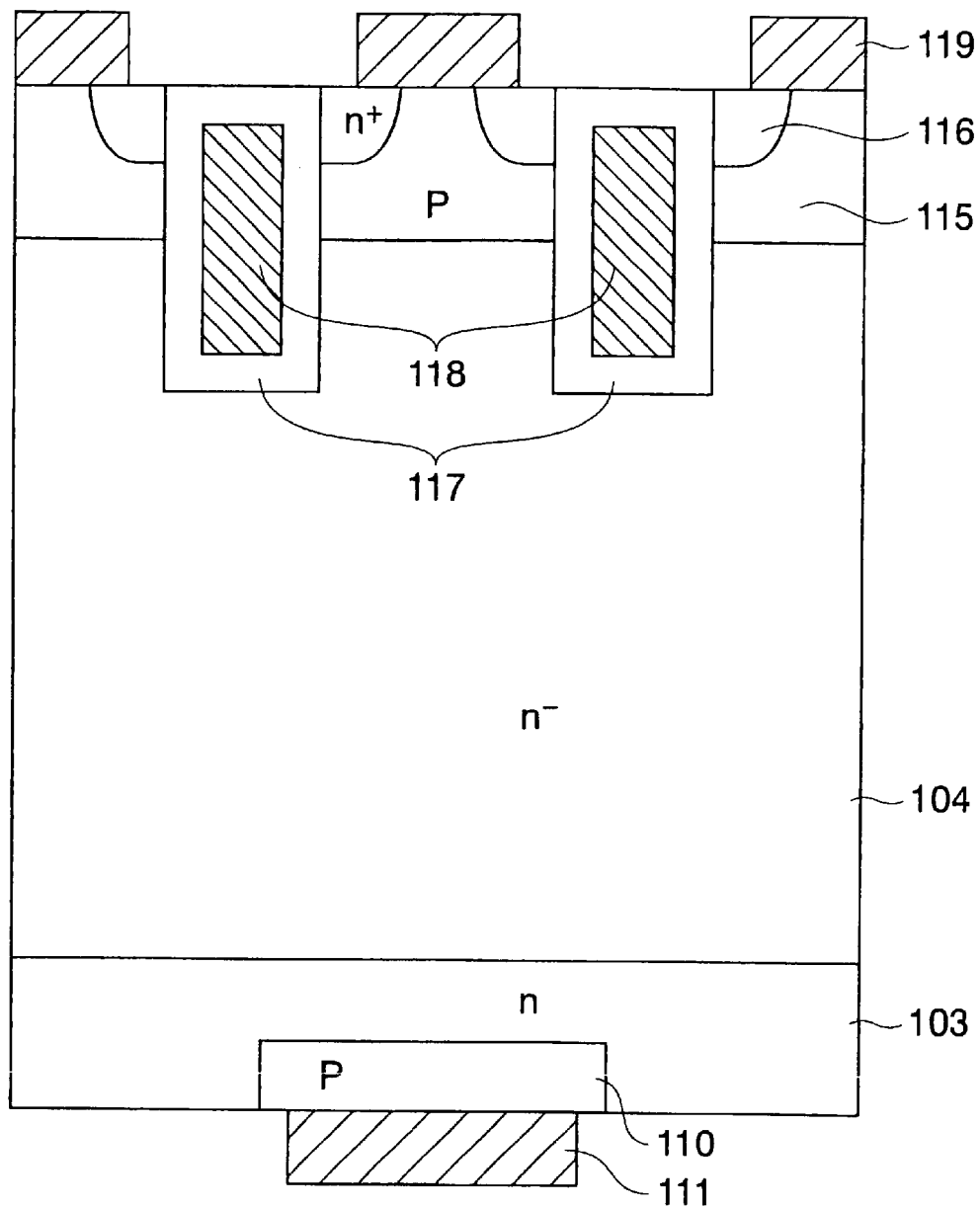
FIG. 10 is a longitudinal sectional view of a vertical IGBT according to the seventh embodiment of the present invention.

FIG. 10 shows the section of a vertical IGBT according to the seventh embodiment of the present invention. A difference from the above sixth embodiment is that in the sixth embodiment the gate electrode 108 is a planar electrode, but in this seventh embodiment gate electrodes 118 on the source side are trench electrodes. Since the gate electrodes 118 on the source side are these trench electrodes, it is possible to increase the MOS channel density and the carrier amount at the source side. The structures of a p-type drain layer 110 and a drain electrode 111 at the drain side are the same as in the sixth embodiment, so a detailed description thereof will be omitted.

Eighth Embodiment

Figure 11:
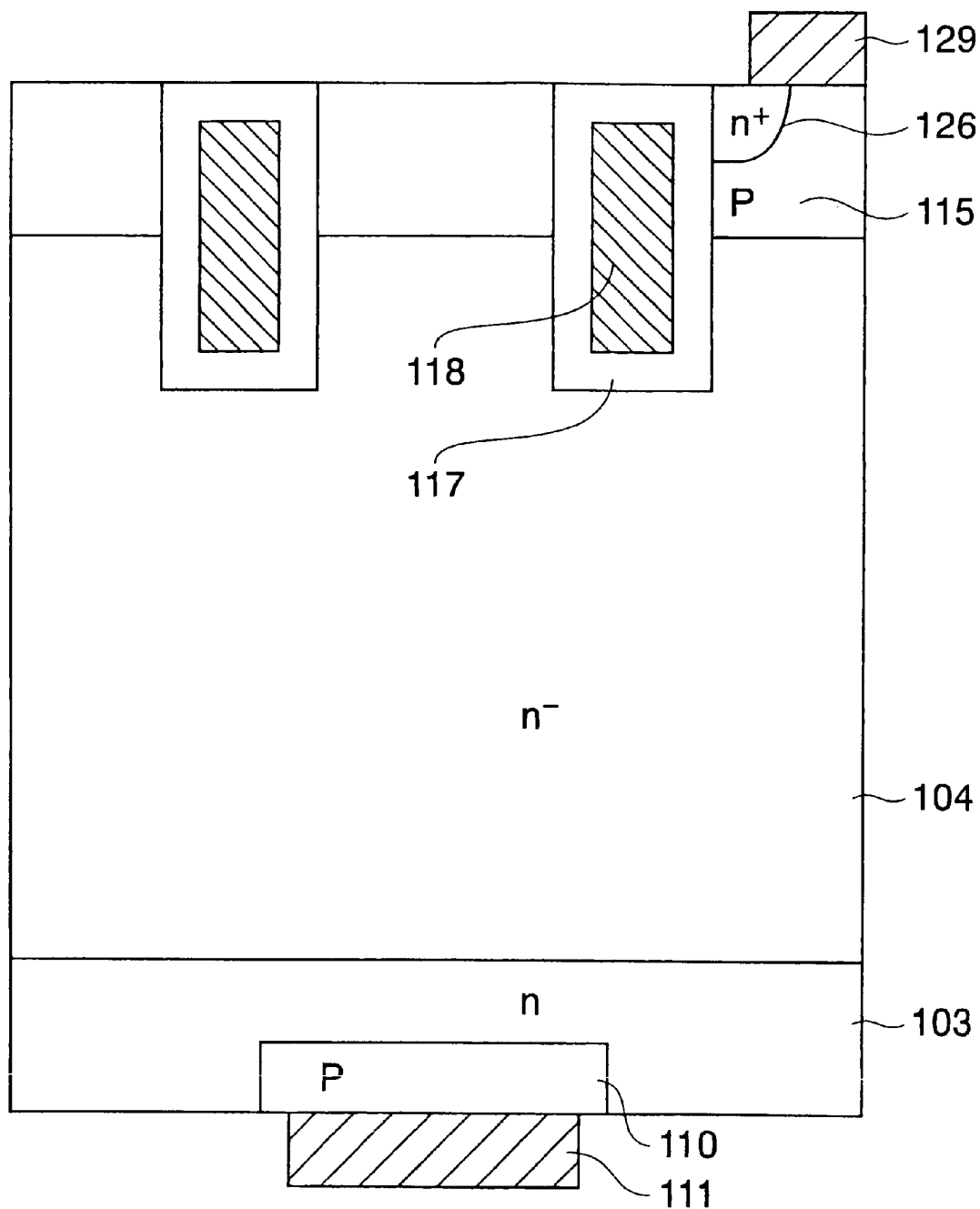
FIG. 11 is a longitudinal sectional view of a vertical IGBT according to the eighth embodiment of the present invention.

FIG. 11 shows the longitudinal section of a vertical IGBT according to the eighth embodiment of the present invention. A difference from the above seventh embodiment is that on the source side, gate electrodes 118 are trench electrodes as in the seventh embodiment, but source electrodes 129 connecting to a p-type base layer 115 and an n⁺-type source layer 126 are thinned at predetermined intervals and thereby reduced in number. This can increase the discharge resistance of holes and enhance the electron injection. This source structure is proposed in the following reference in order to increase the carrier amount at the source side.

M. Kitagawa et al., "A 4500V Injection Enhanced Insulated Gate Bipolar Transistor (IEGT) in a Mode Similar to a Thyristor", IEDM'93, pp. 679–682, 1993.

The structures of a p-type drain layer 110 and a drain electrode 111 on the drain side are the same as those in the sixth and seventh embodiments described above, so a detailed description thereof will be omitted.

Ninth Embodiment

Figure 12:
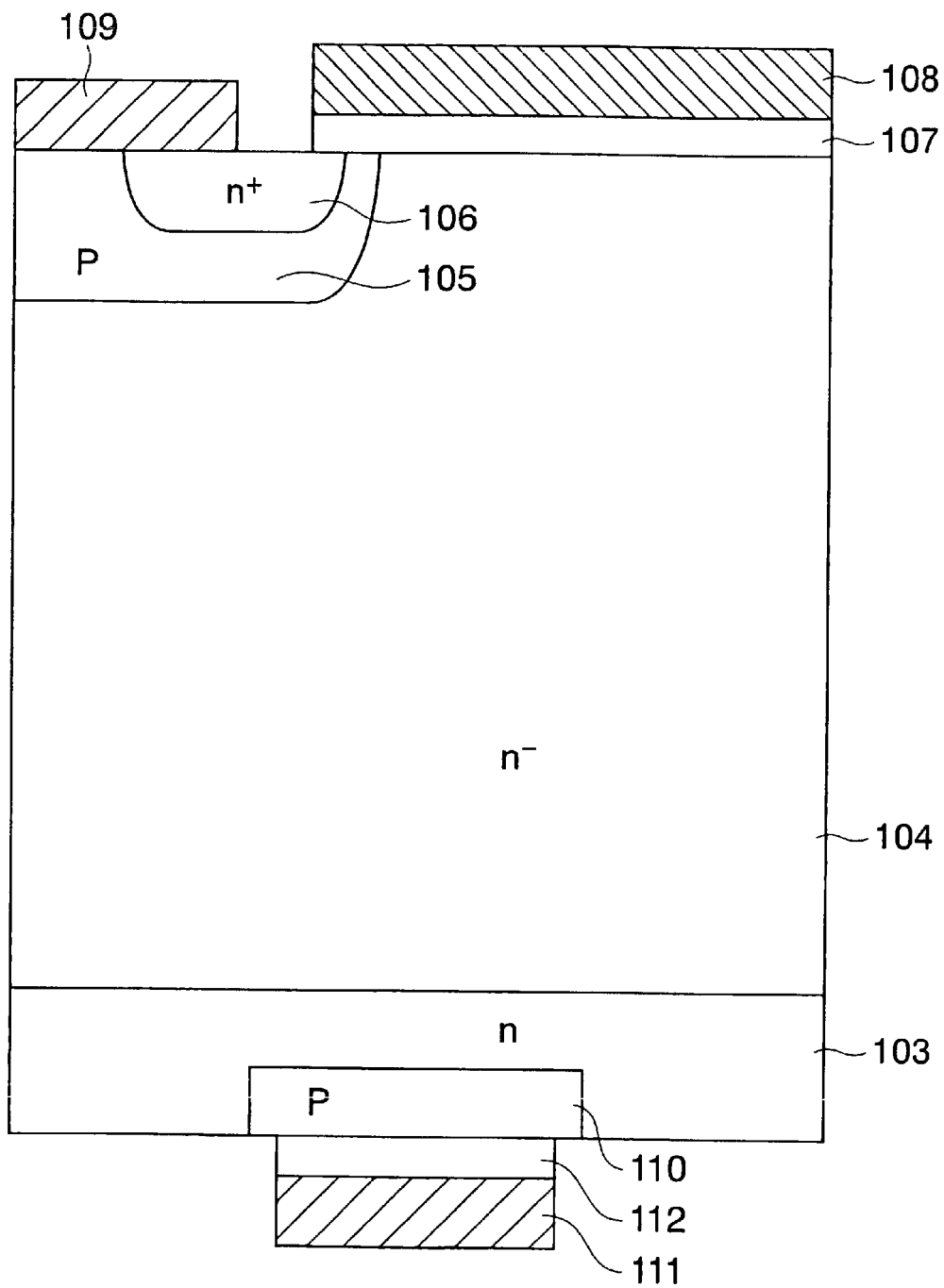
FIG. 12 is a longitudinal sectional view of a vertical IGBT according to the ninth embodiment of the present invention.

FIG. 12 shows the longitudinal section of a vertical IGBT according to the ninth embodiment of the present invention.

Figure 9:
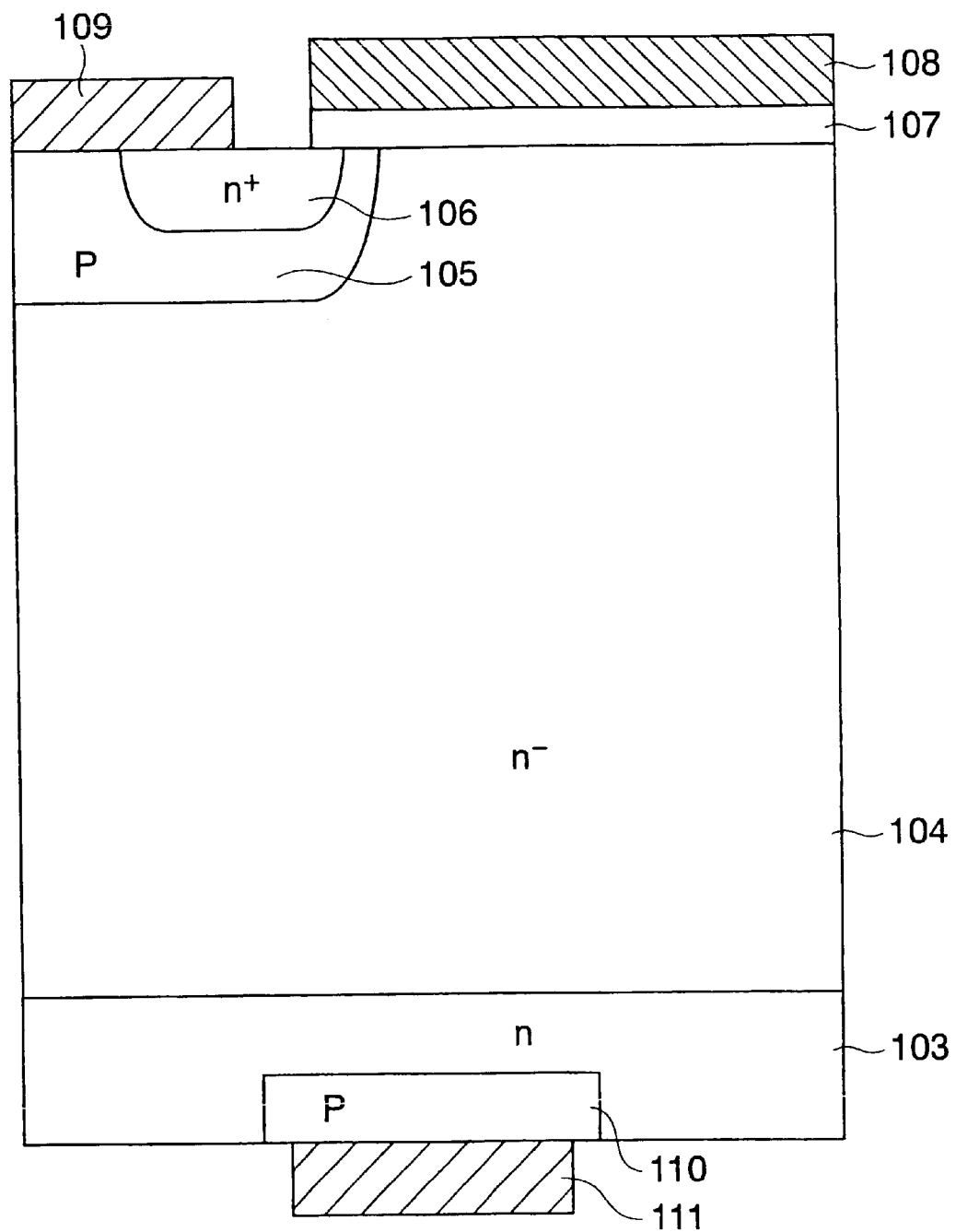
FIG. 9 is a longitudinal sectional view of a vertical IGBT according to the sixth embodiment of the present invention.

A difference from the sixth embodiment shown in FIG. 9 is that a barrier metal layer 112 is formed between a drain electrode 111 and a p-type drain layer 110. The rest of the arrangement is the same as the sixth embodiment, so a detailed description thereof will be omitted.

To suppress injection of holes from the drain side, it is necessary to form this p-type drain layer 110 shallowly by diffusion in the surface of an n-type buffer layer 103. When this drain electrode 111 is formed by commonly used aluminum, however, the aluminum desorbes silicon to cause punchthrough, and this makes it impossible to control the hole injection amount. In this embodiment, therefore, the barrier metal layer 112 (e.g., TiN, TiW, or Ti) is inserted between the drain electrode 111 and the p-type drain layer 110 to prevent the phenomenon in which aluminum in the drain electrode 111 desorbes silicon to cause punchthrough.

A similar effect can be obtained when the barrier metal layer 112 is formed between the drain electrode 111 and the p-type drain layer 110 in the seventh or eighth embodiments described above.

Tenth Embodiment

Figure 13:
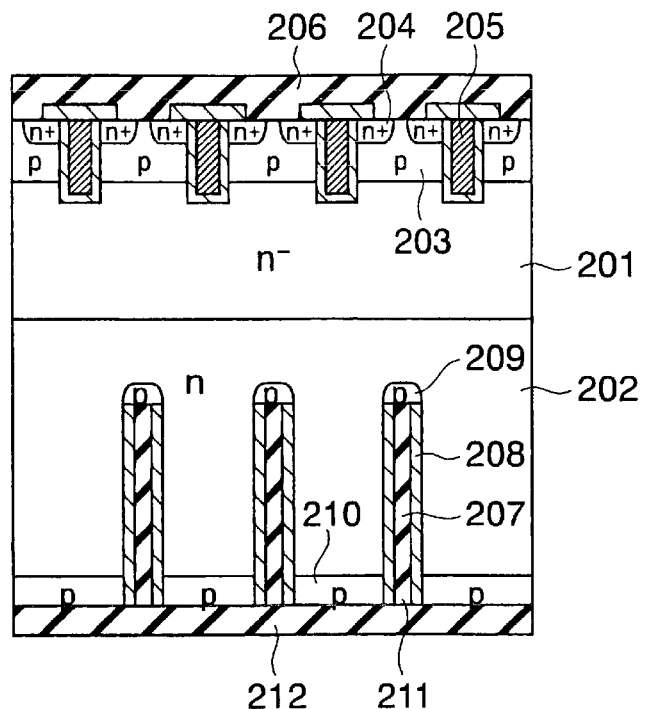
FIG. 13 is a longitudinal sectional view of a vertical IGBT according to the 10th embodiment of the present invention.

FIG. 13 shows the longitudinal sectional structure of a vertical semiconductor device according to the 10th embodiment of the present invention.

Figure 14:
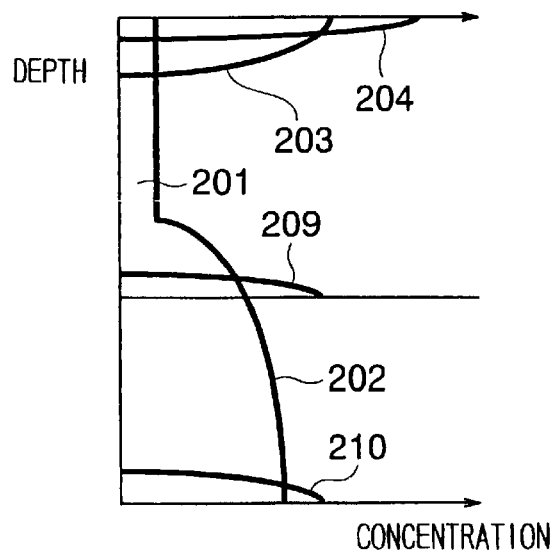
FIG. 14 is a graph showing the concentration profile of the same vertical IGBT.

This embodiment is characterized in that an n-type buffer layer 202 is formed relatively deep in one surface (the lower surface in FIG. 13) of an n$^-$-type substrate 201, and that p-type drain layers 209 are formed by doping an impurity into the bottom surfaces of trenches 207 formed in the n-type buffer layer 202. FIG. 14 shows the impurity profile in the direction of depth.

In this embodiment, the deep n-type buffer layer 202 makes the whole substrate thick and thereby achieves sufficient strength.

Also, in this embodiment, the p-type drain layers 209 are formed in the bottom surfaces of the trenches 207 formed in the n-type buffer layer 202. This can well decrease the thickness from the n-type buffer layer 202 to the upper surface of the n$^-$-type substrate 201.

More specifically, a 100- to 350-$\mu$m thick n-type buffer layer 202 is formed by diffusing an impurity into one surface, the lower one in FIG. 13, of a 150- to 400-$\mu$m thick n$^-$-type substrate 201, and 90- to 340-$\mu$m thick trenches 207 are formed in this n-type buffer layer 202. When p-type drain layers 209 are formed by doping an impurity into the bottom surfaces of these trenches 207, the thickness from the n-type buffer layer 202 to the upper surface of the n$^-$-type substrate 201 is as sufficiently small as 50 to 60 $\mu$m.

Furthermore, the loss can be further reduced because the drain layers 209 are separated from each other.

A method of fabricating the vertical semiconductor device according to this embodiment will be briefly explained below in order of steps. However, the steps of the source side are similar to the aforementioned device relevant to the present invention, so a detailed description thereof will be omitted.

Figure 15:
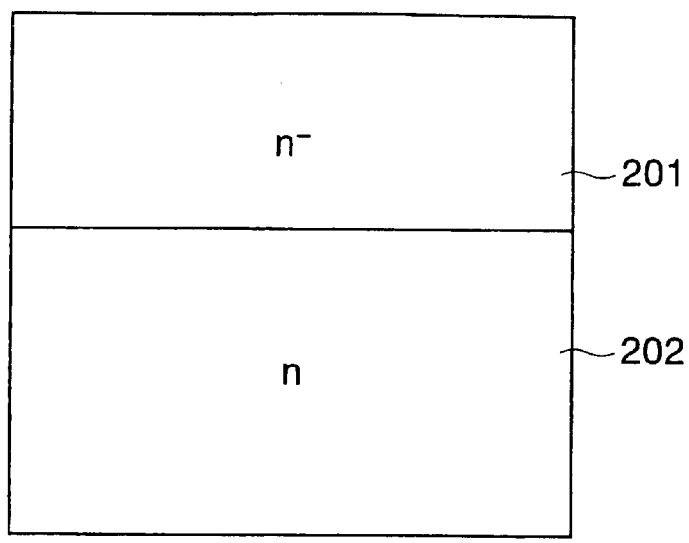
FIG. 15 is a longitudinal sectional view showing a step of fabricating the vertical IGBT according to the 10th embodiment.
Figure 16:
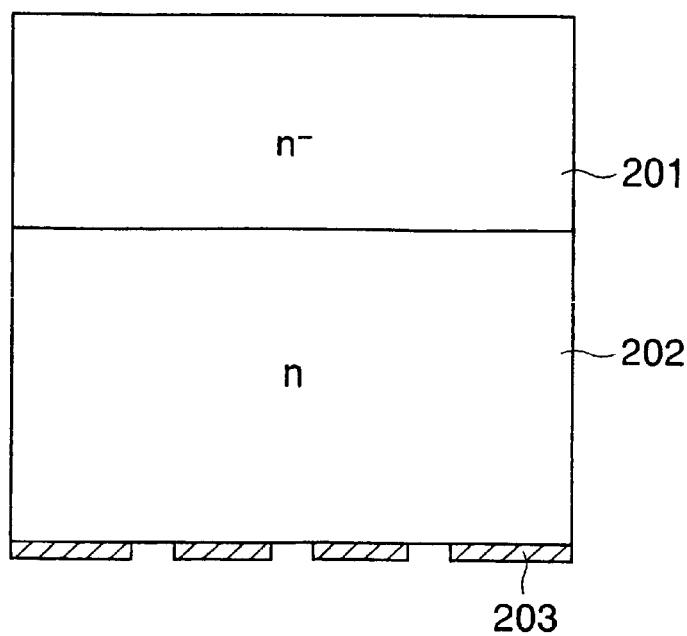
FIG. 16 is a longitudinal sectional view showing a step of fabricating the vertical IGBT according to the 10th embodiment.

As shown in FIG. 15, an n-type buffer layer 202 is formed by diffusing an impurity from one surface, the lower one in FIG. 15, of a 150- to 400-$\mu$m thick n$^-$-type substrate 201. Subsequently, as shown in FIG. 16, the surface of this n-type buffer layer 202 is oxidized to form a silicon oxide film 203. This silicon oxide film 203 is etched to selectively remove prospective trench portions.

As shown in FIG. 17, the remaining silicon oxide film 203 is used as a mask to perform anisotropic etching, thereby forming trenches 207.

As shown in FIG. 18, the entire surface of the n-type buffer layer 202 is oxidized to form a silicon oxide film 208. When this silicon oxide film 208 is etched back, the silicon oxide film 208 remains on the side walls of the trenches 207 as shown in FIG. 19, and the silicon oxide film 208 in the bottom portions of the trenches 207 and on the surface of the n-type buffer layer 202 is removed.

When boron is ion-implanted and annealed in this state, p-type drain layers 209 are formed in the bottom portions of the trenches as shown in FIG. 20. At the same time, a p-type drain layer 210 is formed on the surface of the n-type buffer layer 202. After that, as shown in FIG. 13, buried electrodes 211 are formed in the trenches 207, and a drain electrode 212 is formed on the entire surface.

Note that the n-type buffer layer 202 can also be formed by forming a thick layer by diffusing an impurity into a thick n$^-$-type substrate 201 having a thickness of, e.g., 650 $\mu$m, and polishing this thick layer to a desired thickness after that.

Figure 21:
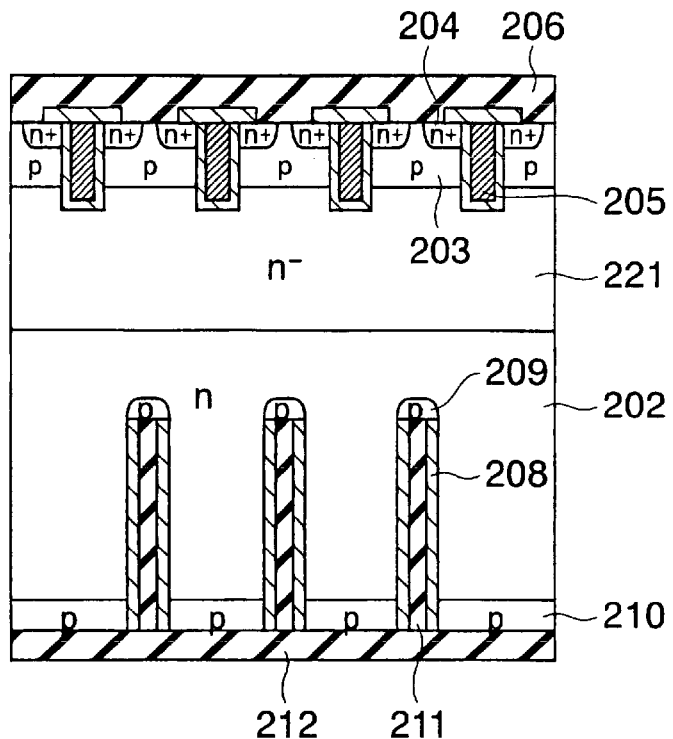
FIG. 21 is a longitudinal sectional view showing a modification of the vertical IGBT according to the 10th embodiment.
Figure 22:
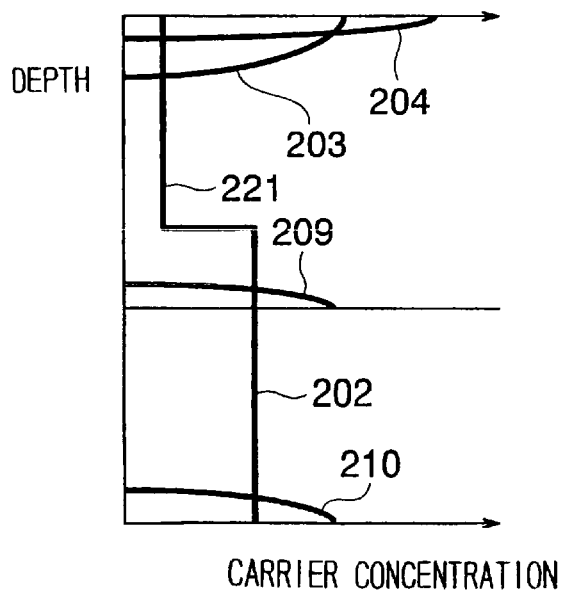
FIG. 22 is a graph showing the concentration profile of the same vertical IGBT.
Figure 24:
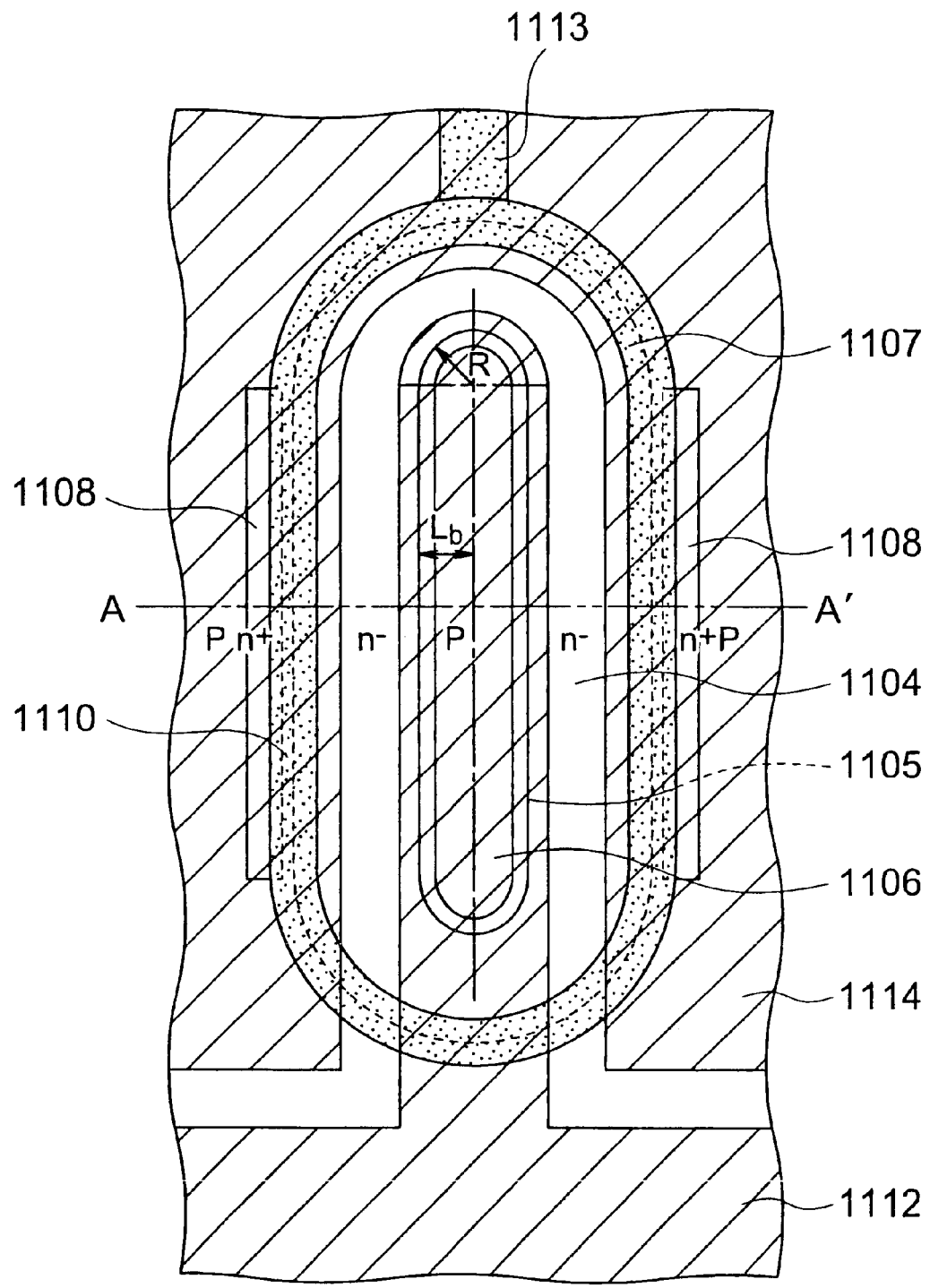
FIG. 24 is a plan view of a lateral IGBT relevant to the present invention.

Alternatively, as shown in FIG. 21, a high-resistance epitaxial layer 221 can also be formed on the surface of the n$^-$-type substrate 201. FIG. 22 shows the impurity profile in this case.

In this embodiment, the gate structure is a trench structure. However, as shown in FIG. 23, this gate structure can also be a planar structure including a p-type base layer 231, an n$^+$-type source layer 232, a source electrode 235, a gate insulating film 233, and a gate electrode 234.

Each of the above embodiments is merely an example and hence can be variously modified without departing from the technical scope of the present invention.

In the lateral semiconductor device of each of the above embodiments, even when the width Lb of the buffer layer is increased, the area of the drain layer can be kept small, so the breakdown voltage is high and the ON voltage is low.

In the vertical semiconductor device of each of the above embodiments, the surface concentration of the drain layer can be raised by controlling injection of holes in accordance with the area ratio of this drain layer. Accordingly, the turn-off characteristics of a vertical IGBT can be improved regardless of variations in the process.

Also, in the vertical semiconductor device of the above-mentioned embodiment, low loss is realized by decreasing the thickness from a drain layer formed in the bottom surface of a trench to a substrate on the source side. In addition, the strength can be increased by increasing the whole thickness of the substrate. This can prevent cracking of the substrate in the fabrication process.

What is claimed is:

1. A lateral semiconductor device comprising:
    a first conductivity type base layer having resistance higher than that of a first conductivity type buffer layer;
    said first conductivity type buffer layer selectively formed in the surface portion of said first conductivity type base layer;
    a second conductivity type drain layer selectively formed in the surface portion of said first conductivity type buffer layer;
    a second conductivity type base layer selectively formed in the surface portion of said first conductivity type base layer so as to surround said first conductivity type buffer layer with a spacing therebetween;
    a first conductivity type source layer selectively formed in the surface portion of said second conductivity type base layer;
    a gate electrode formed via a gate insulating film on the surface of said second conductivity type base layer sandwiched between said first conductivity type base layer and said first conductivity type source layer;
    a source electrode in contact with said second conductivity type base layer and said first conductivity type source layer; and a drain electrode in contact with said second conductivity type drain layer, wherein said second conductivity type drain layer has a structure in which said first conductivity type buffer layer not in contact with said drain electrode is exposed in a portion of said second conductivity type drain layer.

2. A device according to claim 1, wherein said first conductivity type buffer layer has a striped shape having two end portions protruding outward into the shape of an arc;

the inner circumferential surface of said second conductivity type base layer has the same shape as said first conductivity type buffer layer;

said first conductivity type source layer has a striped shape selectively formed to oppose a straight portion of the stripe of said first conductivity type buffer layer; and said second conductivity type drain layer has an annular structure whose inner and outer circumferential surfaces have the same shape as said first conductivity type buffer layer, and said first conductivity type buffer layer not in contact with said drain electrode is exposed inside the annular structure.

3. A device according to claim 2, wherein said first conductivity type drain layer having an annular structure, horseshoe-shaped structure, or U-shaped structure comprises an aggregate of a plurality of rectangular drain layer portions.

4. A device according to claim 2, wherein said second conductivity type drain layer is shifted to said first conductivity type source layer in the widthwise direction of said first conductivity type buffer layer.

5. A device according to claim 1, wherein said first conductivity type buffer layer has a striped shape having two end portions protruding outward into the shape of an arc;

the inner circumferential surface of said second conductivity type base layer has the same shape as said first conductivity type buffer layer;

said first conductivity type source layer has a striped shape selectively formed to oppose a straight portion of the stripe of said first conductivity type buffer layer; and said second conductivity type drain layer has a horseshoe-shaped structure or U-shaped structure, and said first conductivity type buffer layer not in contact with said drain electrode is exposed inside the horseshoe-shaped structure or U-shaped structure.

6. A device according to claim 5, wherein said first conductivity type drain layer having an annular structure, horseshoe-shaped structure, or U-shaped structure comprises an aggregate of a plurality of rectangular drain layer portions.

7. A device according to claim 5, wherein said second conductivity type drain layer is shifted to said first conductivity type source layer in the widthwise direction of said first conductivity type buffer layer.

8. A device according to claim 1, wherein said first conductivity type buffer layer has a striped shape having two end portions protruding outward into the shape of an arc;

the inner circumferential surface of said second conductivity type base layer has the same shape as said first conductivity type buffer layer;

said first conductivity type source layer has a striped shape selectively formed to oppose a straight portion of the stripe of said first conductivity type buffer layer; and said second conductivity type drain layer has a plurality of juxtaposed stripe structures, and said first conductivity type buffer layer not in contact with said drain electrode is exposed between the stripes.

9. A device according to claim 8, wherein said second conductivity type drain layer is shifted to said first conductivity type source layer in the widthwise direction of said first conductivity type buffer layer.

10. A device according to claim 1, wherein said first conductivity type buffer layer has a striped shape having two end portions protruding outward into the shape of an arc;

the inner circumferential surface of said second conductivity type base layer has the same shape as said first conductivity type buffer layer;

said first conductivity type source layer has a striped shape selectively formed to oppose a straight portion of the stripe of said first conductivity type buffer layer; and said second conductivity type drain layer has a plurality of juxtaposed stripe structures, each stripe comprises an aggregate of a plurality of rectangular drain layer portions, and said first conductivity type buffer layer not in contact with said drain electrode is exposed between the stripes and between the rectangles.

11. A device according to claim 10, wherein said second conductivity type drain layer is shifted to said first conductivity type source layer in the widthwise direction of said first conductivity type buffer layer.

12. A device according to claim 1, wherein said first conductivity type buffer layer has a striped shape having two, upper and lower end portions protruding outward into the shape of an arc;

the inner circumferential surface of said second conductivity type base layer has the same shape as said first conductivity type buffer layer;

said first conductivity type source layer has a striped shape selectively formed to oppose a straight portion of the stripe of said first conductivity type buffer layer; and said second conductivity type drain layer comprises a plurality of linearly arranged rectangular drain layer portions, and said first conductivity type buffer layer not in contact with said drain electrode is exposed between adjacent drain layer portions.

13. A device according to claim 12, wherein the rectangular drain layer portions of said second conductivity type drain layer are long along the widthwise direction of said first conductivity type buffer layer.

* * * * *